(12) United States Patent
Turner et al.

(10) Patent No.: US 7,821,250 B2
(45) Date of Patent: Oct. 26, 2010

(54) RF SENSOR CLAMP ASSEMBLY

(75) Inventors: Terry A. Turner, Austin, TX (US);
Rodney A. Herman, Austin, TX (US);
Duane T. Smith, Round Rock, TX (US);
James D. Spain, Georgetown, TX (US)

(73) Assignee: Inficon, Inc., Syracuse, NY (US)

( * ) Notice: Subject to any disclaimer, the term of this patent is extended or adjusted under 35 U.S.C. 154(b) by 188 days.

(21) Appl. No.: 11/496,277

(22) Filed: Jul. 31, 2006

(65) Prior Publication Data
US 2008/0024158 A1 Jan. 31, 2008

(51) Int. Cl.
*G01R 25/02* (2006.01)
(52) U.S. Cl. ......................................................... 324/95
(58) Field of Classification Search ............. 324/117 H, 324/117 R, 127, 95, 96
See application file for complete search history.

(56) References Cited

U.S. PATENT DOCUMENTS

| | | | |
|---|---|---|---|
| 2,760,157 A | 8/1956 | Dexter | |
| 2,843,827 A | 7/1958 | Blonder | |
| 4,785,345 A * | 11/1988 | Rawls et al. ................. | 257/531 |
| 4,794,327 A * | 12/1988 | Fernandes ................... | 324/126 |
| 4,829,298 A * | 5/1989 | Fernandes .............. | 340/870.27 |
| 4,935,693 A * | 6/1990 | Falkowski et al. ........... | 324/127 |
| 5,426,360 A * | 6/1995 | Maraio et al. ................ | 324/126 |
| 5,770,922 A | 6/1998 | Gerrish et al. | |
| 5,808,415 A | 9/1998 | Hopkins | |
| 5,867,020 A | 2/1999 | Moore | |
| 6,501,285 B1 * | 12/2002 | Hopkins et al. ............. | 324/687 |
| 6,608,446 B1 * | 8/2003 | Coumou ...................... | 324/464 |
| 6,677,743 B1 * | 1/2004 | Coolidge et al. ............ | 324/126 |
| 7,005,845 B1 * | 2/2006 | Gonzalez et al. ........ | 324/117 R |
| 7,345,428 B2 * | 3/2008 | Turner ...................... | 324/76.11 |
| 7,403,764 B2 * | 7/2008 | Turner ................... | 315/111.21 |
| 7,728,250 B2 * | 6/2010 | Turner et al. ........... | 315/111.51 |
| 2005/0211381 A1 * | 9/2005 | Turner et al. ........... | 156/345.28 |
| 2006/0084397 A1 * | 4/2006 | Turner et al. ................. | 455/117 |
| 2006/0116106 A1 * | 6/2006 | Turner ........................ | 455/410 |
| 2009/0048792 A1 * | 2/2009 | Turner ......................... | 702/60 |

* cited by examiner

*Primary Examiner*—Jermele M Hollington
(74) *Attorney, Agent, or Firm*—John A. Fortkort; FortKort & Houston P.C.

(57) ABSTRACT

A clamp assembly for bringing an RF sensor into electrical contact with an RF current carrier is provided herein. The clamp assembly (101) comprises a first wedge-shaped element (103), and a second wedge-shaped element (105) which is slidingly engaged with said first wedge-shaped element. Preferably, the clamp assembly also comprises a collar (113) within which the first and second wedge-shaped elements are disposed. The clamp assembly preferably further comprises a fastener (111), such as a screw, which adjoins the first and second elements, in which case the clamp assembly is adapted such that, as the screw is rotated in a first direction, at least one of the first and second elements expands against the collar and/or the RF current carrier.

28 Claims, 38 Drawing Sheets

RF SENSOR CLAMP ASSEMBLY

CROSS-REFERENCE TO RELATED APPLICATIONS

This application claims the benefit of priority from PCT/US2005/004839 filed Jan. 31, 2005, now pending, having the same title, and having the same inventors, and which is incorporated herein by reference in its entirety; which claims priority from U.S. Provisional Patent Application No. 60/541,465 filed Feb. 2, 2004, now completed.

TECHNICAL FIELD

The present disclosure relates generally to RF sensors, and more particularly to clamping mechanisms suitable for use in bringing these sensors into electrical contact with an RF current carrier.

BACKGROUND ART

Plasma etch and deposition processes have become the dominant pattern transfer means used in semiconductor manufacturing over the past 20 years. Most plasma based processes employ the fundamental principle of disassociation of a feed gas by the application of radio frequency (RF) power.

As with all plasma loads, one of the dominant characteristics of the plasma load is its non-linearity. The non-linearity of the load affects the voltage and current sine waves of the delivered RF power by creating prevalent harmonic distortion. The exact amount of harmonic distortion, as represented by the amplitude of the harmonic frequencies and the associated phase angle of the current harmonic relative to the corresponding voltage harmonic, is unique to the plasma creating them. To be more precise, the plasma parameters, including ion and electron densities and energies, collision frequencies, neutral constituents, and their respective densities all contribute in a unique way to the amplitude of specific harmonic components of the fundamental frequency applied by a power delivery source to achieve the desired disassociation and subsequent process results.

It is thus apparent that, by monitoring the harmonic components of the fundamental frequency in the delivered RF power, enhanced process control of plasma deposition and etch processes may be obtained. Consequently, various sensors have been developed in the art for this purpose.

Conventional RF sensors require that the current carrier be physically disrupted and reconnected at the terminals of the sensor. This has the effect of adding physical and electrical length to the current carrier due to the addition of the internal conductor of the sensor to the current path. Moreover, the addition of conventional RF sensors to a system frequently requires the addition of even further current carrier to allow the system components to be rearranged so as to avoid interference between the RF sensors and other system components, and to allow for proper grounding of all of the components.

While the addition of current carrier may be tolerable in some lower frequency applications, many plasma reactors today are designed to operate at fundamental frequencies that are in the megahertz region (and at harmonics of these frequencies that are often up to 300 megahertz). At these frequencies, the addition of even a few centimeters of current carrier, and the associated increase in electrical length, is significant in terms of the added capacitance and the shift in phase angle that it induces. Indeed, it is often necessary, after these RF sensors have been installed, to add additional capacitance to the RF current carrier so that the phase angle will be rotated around the Smith chart, thereby compensating for this effect. The need for such adjustments unduly complicates the installation of the sensor and can require recalibration of system parameters, since the calibration coefficients determined for the sensor at the point of manufacture may no longer be accurate.

There is thus a need in the art for an RF sensor, suitable for use with plasma reactors, which does not add to the electrical length of the RF current carrier. There is further a need in the art for a method and device for incorporating an RF sensor into the RF current carrier that does not require the current carrier to be broken, and that does not necessitate the addition of electrical length to the current carrier. There is also a need in the art for a method for measuring RF frequencies that does not significantly modify the attributes of the RF current. These and other needs are met by the devices and methodologies disclosed herein.

BRIEF DESCRIPTION OF THE DRAWINGS

For a more complete understanding of the present invention, and the advantages thereof, reference is now made to the following brief descriptions taken in conjunction with the accompanying drawings, in which like reference numerals indicate like features.

MODES FOR CARRYING OUT THE INVENTION

An RF sensor, suitable for use with plasma reactors, is provided herein. The sensor utilizes a novel clamp assembly that enables the sensor to be readily attached to the outer surface of an RF current carrier. Since the sensor merely attaches to the surface of the RF current carrier, it does not add to the electrical length of the RF current carrier, and it does not require the current carrier to be broken in order to accommodate the sensor. Consequently, the sensor permits the characteristics (e.g., phase angle, DC voltage, RF voltage, and RF current) of the RF power supply and current carrier to be measured without significantly modifying any of these attributes. Therefore, use of the clamp assembly avoids the need for recalibration after the sensor is attached to the current carrier.

Figure 1:
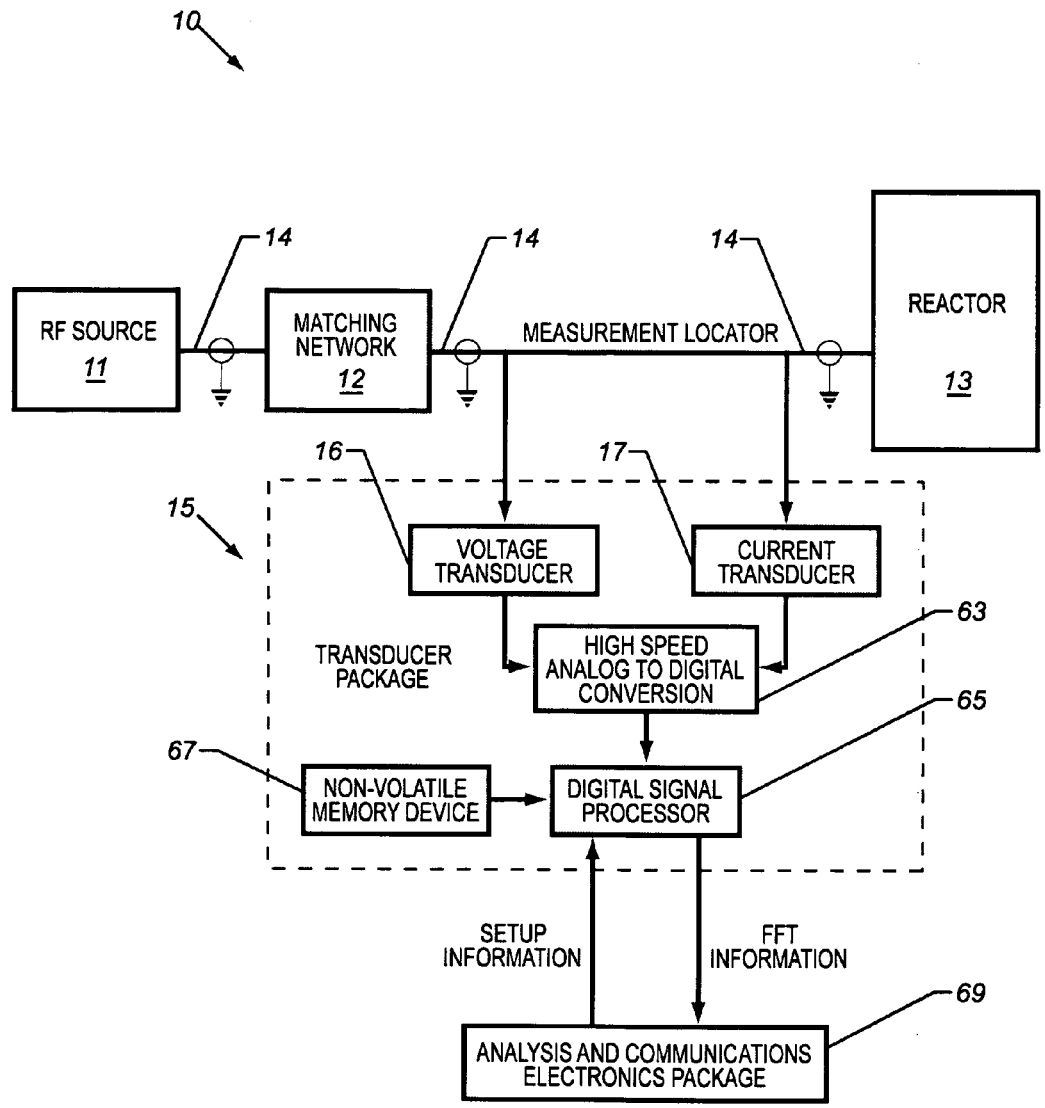
FIG. 1 is a functional block diagram of an RF detector made in accordance with the teachings herein.
Figure 2:
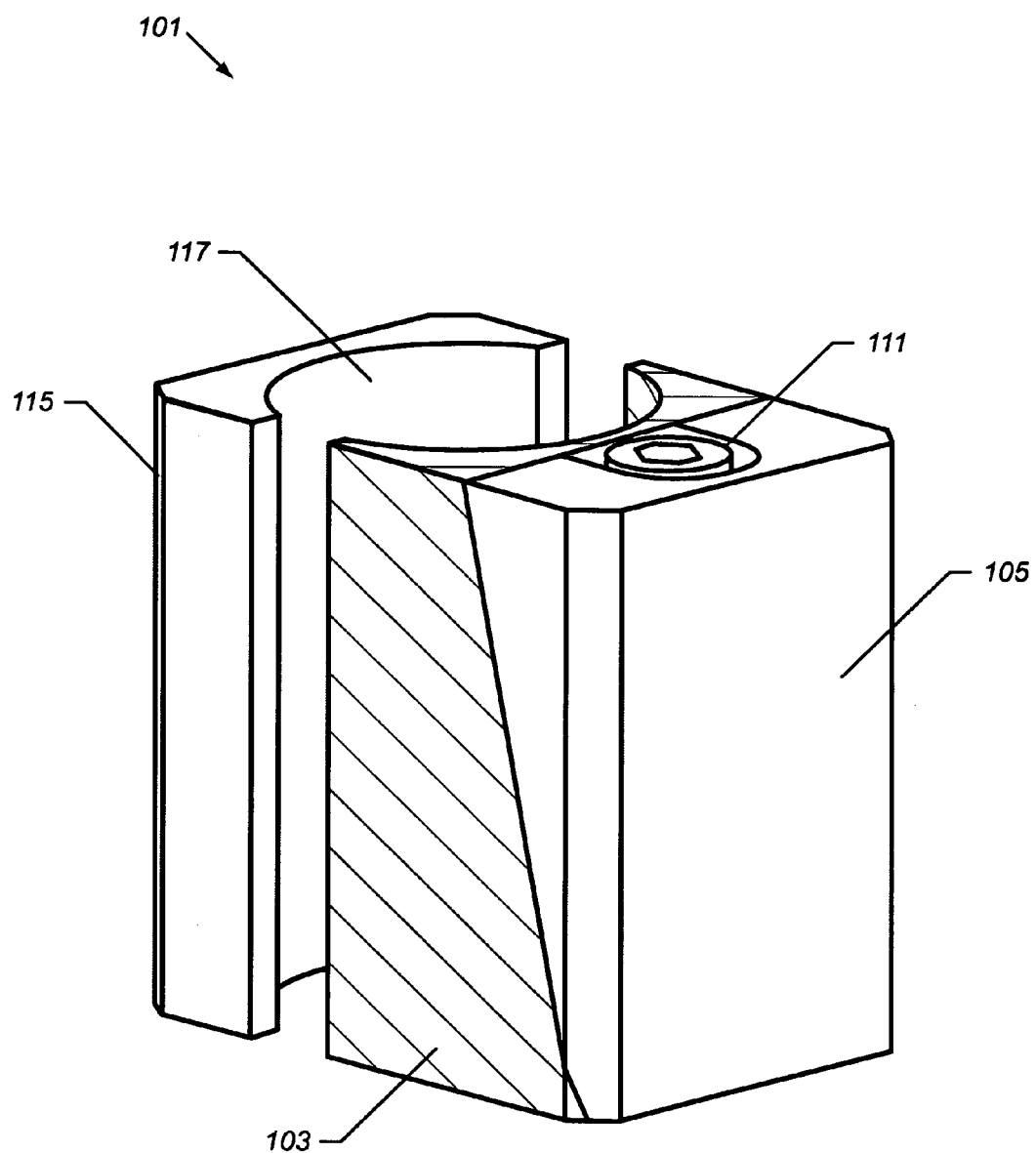
FIGS. 2-3 are perspective views of a first embodiment of an RF sensor clamp assembly made in accordance with the teachings herein.
Figure 3:
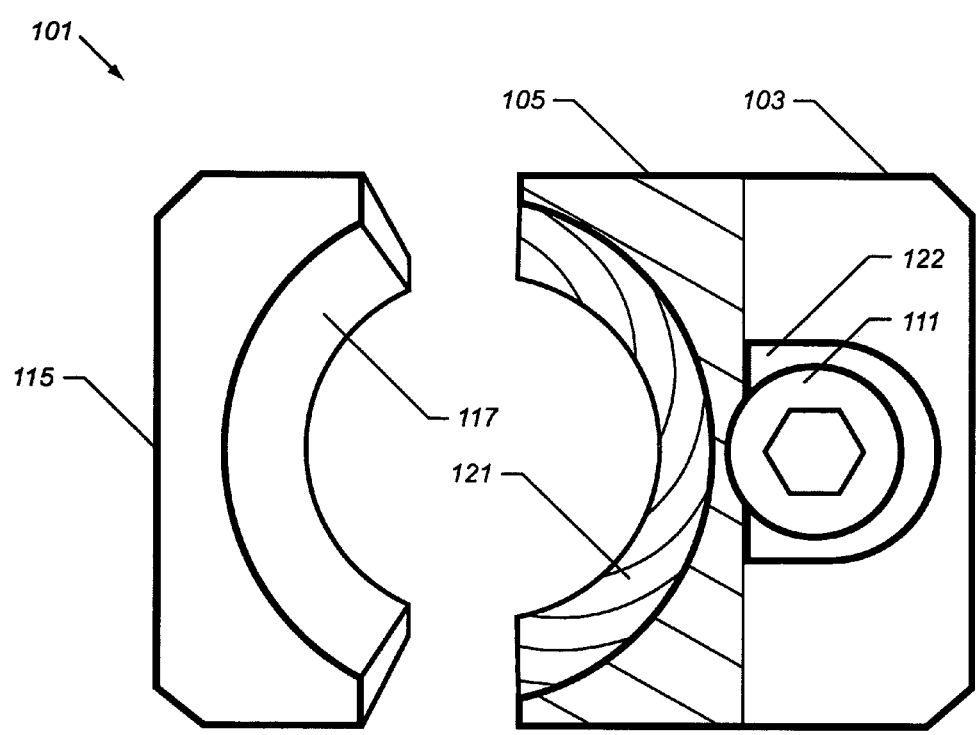
Figure 4:
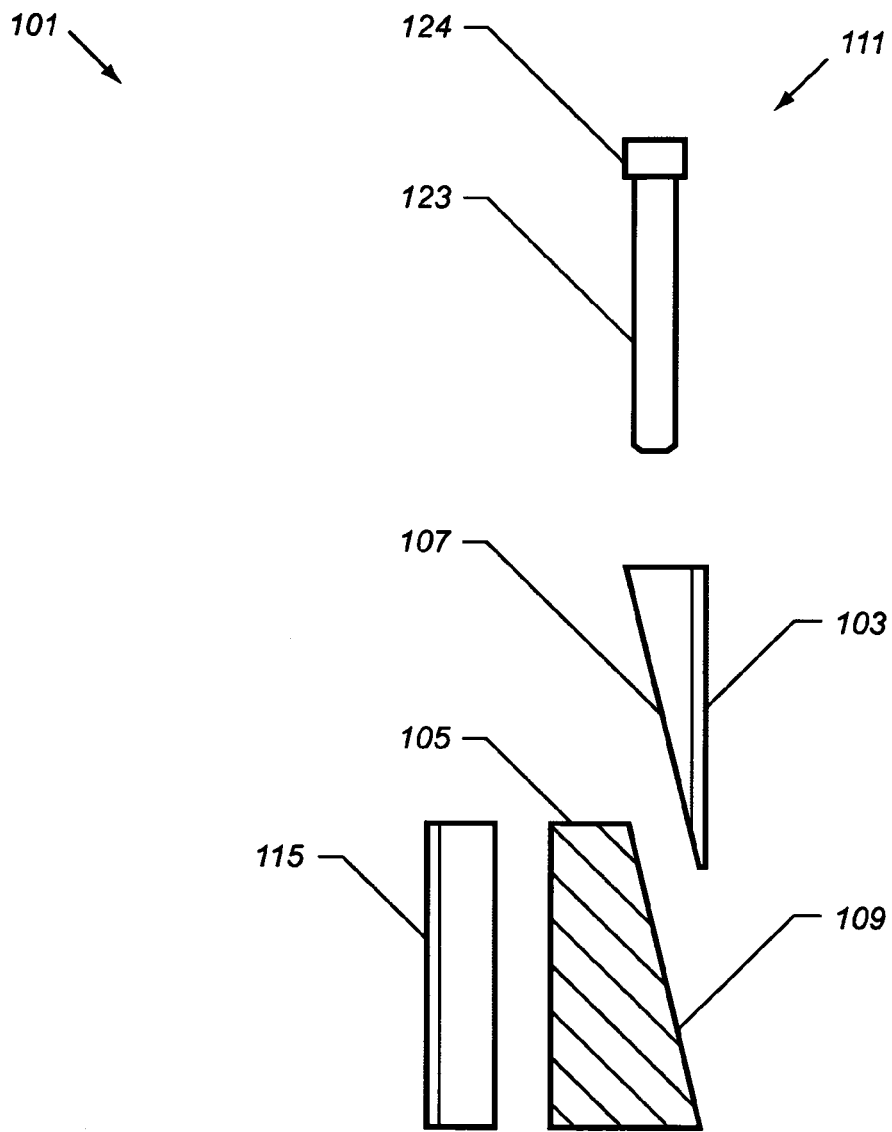
FIG. 4 is an exploded side view of the RF sensor clamp assembly of FIG. 2.
Figure 5:
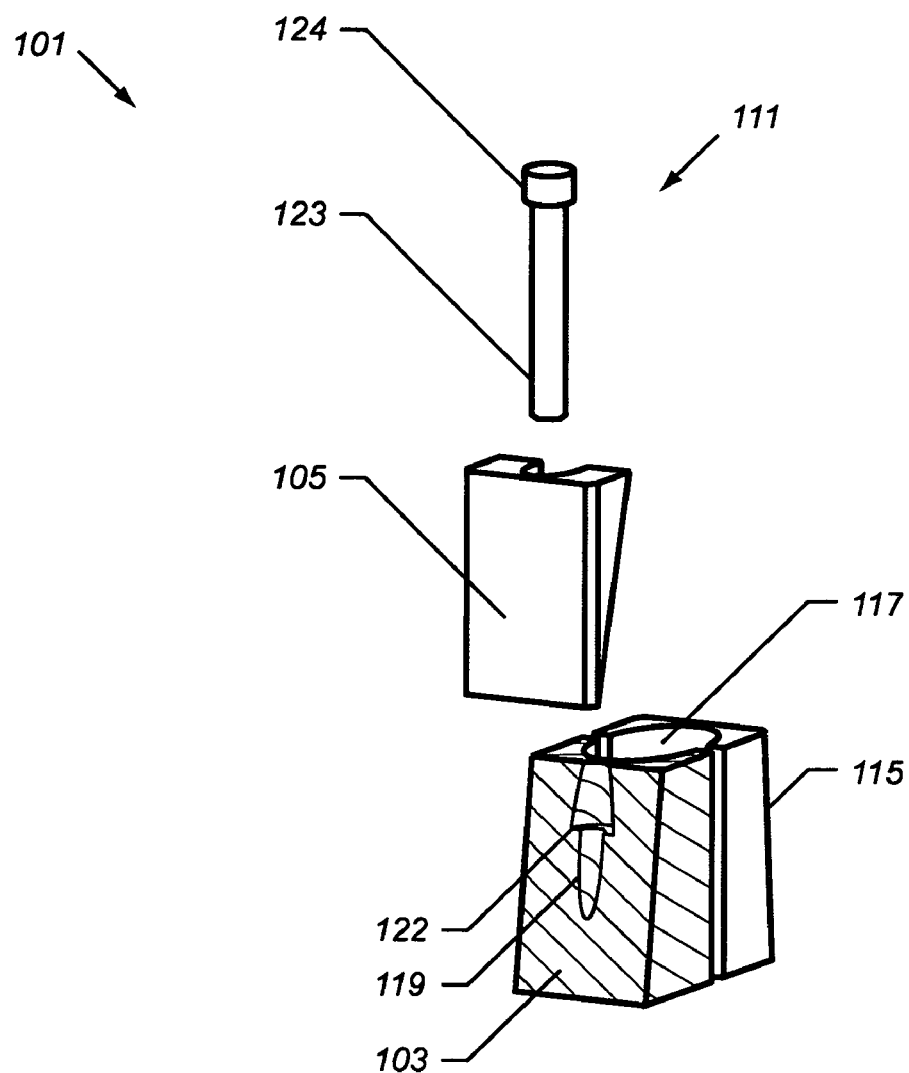
FIGS. 5-7 are exploded perspective views of the RF sensor clamp assembly of FIG. 2.
Figure 6:
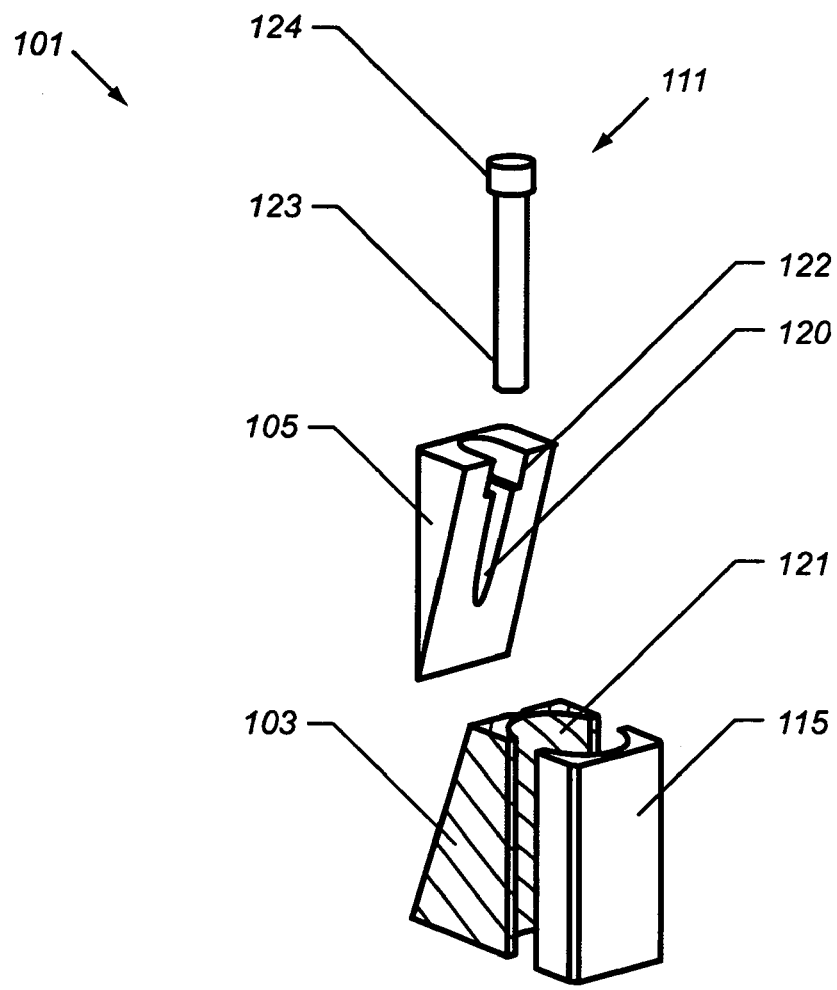

FIG. 1 is a block diagram which depicts the placement and general layout of an RF sensor in one non-limiting embodiment of an RF controlled system made in accordance with the teachings herein. In the system 10 depicted, an electrical source in the form of an RF generator 11 (RF source) is coupled to a processing reactor 13 through a matching network 12 by transmission line 14. The reactor 13 can be any of a variety of reactors, including plasma reactors, that are used for processing a variety of materials, including semiconductor wafers. Moreover, one skilled in the art will appreciate that the teachings herein can be applied to a variety of processing systems, or combinations of such systems, that utilize electrical or microwave energy (including RF) sources. Furthermore, while the use of a matching network 12 is preferred, it is not necessarily needed in all applications of the sensor described herein.

As shown in FIG. 1, a transducer package 15 is attached to the transmission line 14 in a location proximal to the reactor 13, and is preferably disposed at some point after the matching network 12. It is preferred to have the transducer package 15 in as close proximity to the reactor 13 as possible, so that the measurements obtained from the transducer package 15 are indicative of actual V and I values entering the reactor 13. Both V and I values are sensed at substantially the same point on the transmission line 14 in order to determine the power entering the reactor 13 and, in some instances, a phase relationship between V and I.

Appropriate broadband voltage 16 and current 17 transducers are incorporated into the transducer package 15. These transducers are designed to sample, respectively, the voltage and current components of the delivered RF power. The transducer package further includes a high speed analog to digital converter (ADC) 63, a digital signal processor (DSP) 65, and a (preferably non-volatile) memory device 67. The transducer package 15 is maintained in a measurement location which is local to the RF transmission line 14.

The configuration shown in FIG. 1 further comprises an analysis and communications package 69 which is located remote from the transducer package 15. Communications between the transducer package 15 and the remote analysis and communications package 69 typically comprise setup commands sent to the DSP necessary for proper operation.

The memory device 67 included in the transducer package stores necessary calibration information specific to the transducer package for access by the system. This device may also be used to store other appropriate information, such as serial numbers and data required for tracking purposes. Typically, the memory device will be a built-in component of one of the PCBs utilized in the RF sensor, but other types of memory devices may also be utilized, including removable memory chips that are insertable into a port provided on a PCB. Memory devices may also be utilizes that are not directly attached to a PCB, but are in communication with the appropriate circuitry, as by wireless transmission or other suitable means.

FIGS. 2-7 depict a first embodiment of a clamp assembly useful in the RF sensors disclosed herein when used in conjunction with rod-shaped current carriers. Such current carriers commonly have a diameter of 0.5" or 0.625". One skilled in the art will appreciate, however, that the devices described herein are not specifically limited to current carriers of any particular diameter, and that the dimensions of these devices can be appropriately modified to accommodate current carriers of other diameters and shapes.

Figure 7:
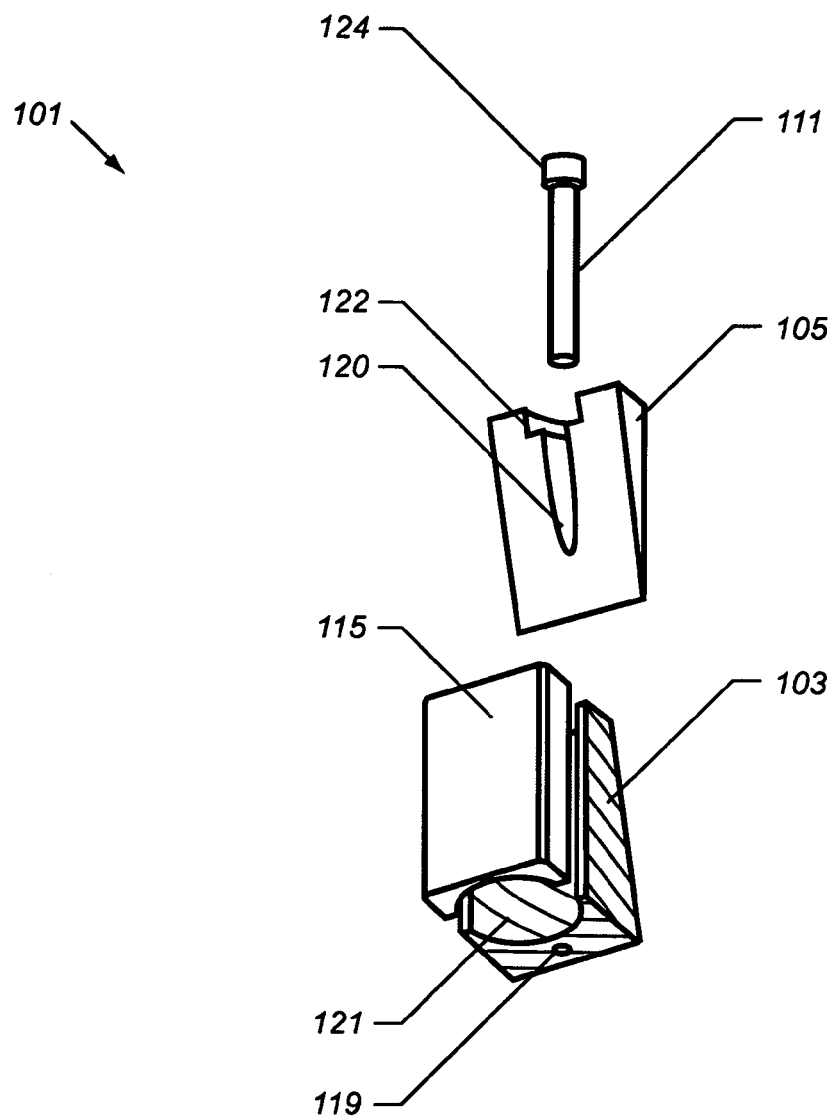

Referring again to FIGS. 2-7, the clamp assembly 101 comprises first 103 and second 105 wedge inserts that are slidingly engaged across first 107 and second 109 opposing surfaces (see, e.g., FIG. 4) by means of a fastener, which in this particular embodiment is a socket head cap screw 111. As the cap screw is tightened (typically by rotating it in a clockwise manner), the assembly of the first 103 and second 105 wedge inserts expands. Conversely, as the cap screw is loosened (typically by rotating it in a counterclockwise manner), the assembly of the first 103 and second 105 wedge inserts contracts or relaxes. Although not specifically shown, the cap screw preferably has a threaded surface on its shaft 123 (see FIG. 4) that rotatingly engages complimentary threads provided on the surfaces of apertures 119 and 120 (see FIGS. 5 and 6) that are provided in wedge inserts 103 and 105, respectively. The cap screw 111 is also provided with a cap 124 that halts the progress of the screw in the axial direction when the cap abuts a ledge 122 defined in aperture 119 (see, e.g., FIG. 5). As shown in FIG. 7, the aperture 119 may extend through the bottom of wedge insert 103 to permit the egress of metal shavings or other debris that may accumulate in the aperture from time to time.

Figure 8:
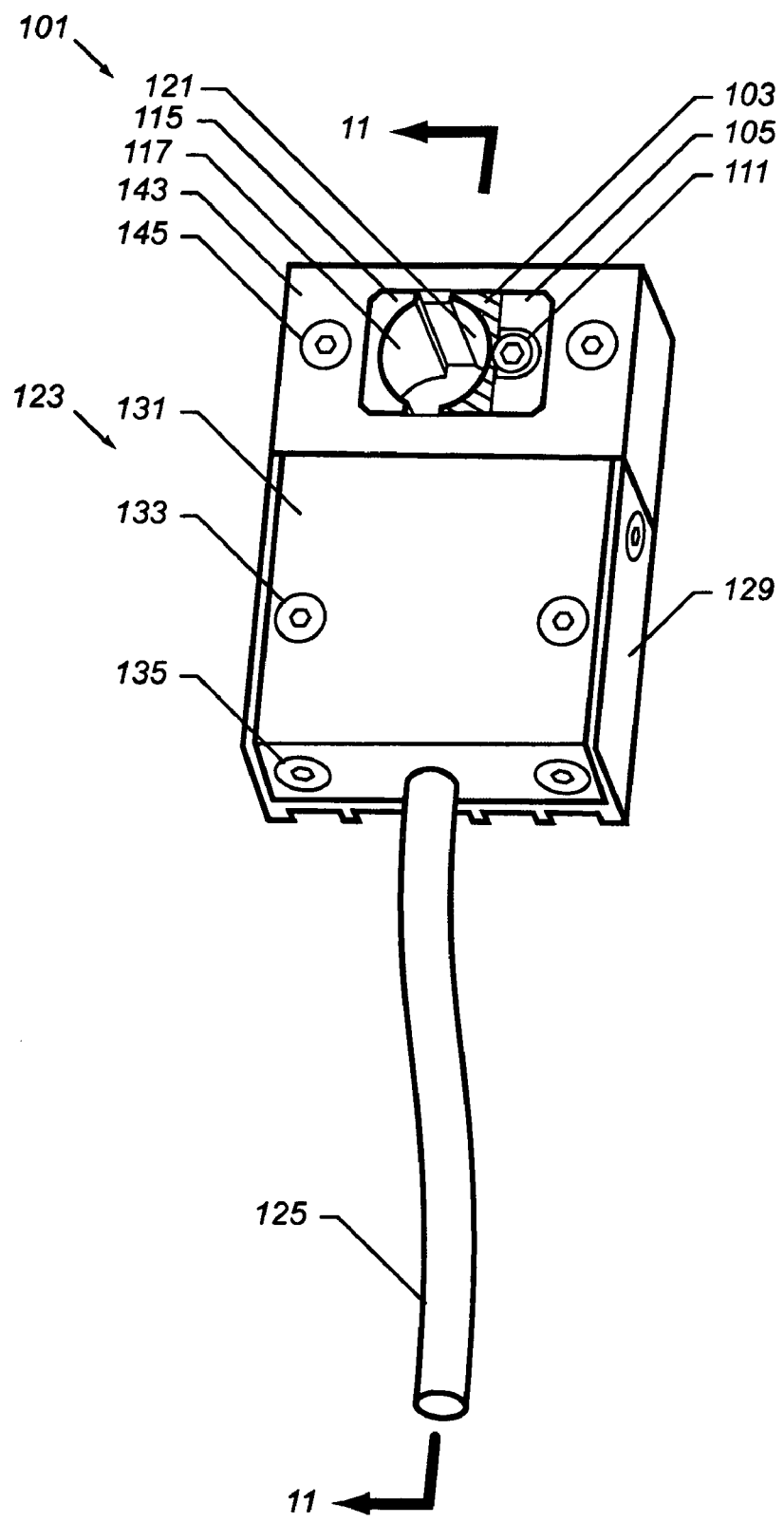
FIG. 8 is a perspective view of an RF sensor made in accordance with the teachings herein which incorporates the RF sensor clamp assembly of FIG. 2.

In use, the first 103 and second 105 wedge inserts and the cap screw 111 are disposed within a collar 113 (see FIGS. 9-13) and are placed on one side of the rod-shaped current carrier (not shown). A back insert 115 (see FIGS. 2-8) is positioned within the collar on the opposing surface of the current carrier (the positioning of these elements within the collar is best shown in FIG. 8). The back insert has a curved surface 117 (best seen in FIGS. 2-3 and 8) that is complimentary in shape to the exterior surface of the current carrier. Similarly, the first 103 wedge insert has a curved surface 121 (see, e.g., FIG. 3) that is also complimentary in shape to the exterior surface of the current carrier. As the cap screw is tightened, the assembly of the first 103 and second 105 wedge inserts expands. Since this assembly and the back insert are held in place by the rigid collar, the expansion of the assembly causes the clamp assembly to firmly grip the surface of the current carrier.

FIGS. 8-11 show different views of one possible embodiment of a complete RF sensor 123 that incorporates the clamp assembly of FIGS. 2-7. The RF sensor includes a cable 125 which connects the internal circuitry of the sensor to a source of electrical current via a power line. In addition to a power line, the cable may contain various other components, such as a ground line, sense lines (e.g., for a DC power supply), communication lines (such as RS-485 cables or the like), and layers or portions (e.g., of aluminum, glass fibers, and the like) that provide electrical, magnetic, or thermal insulation or shielding. The sensor also includes a series of (preferably digital) circuit boards 126, 127 (see FIGS. 9-11) which perform the logical functions of the sensor as are involved, for example, in the measurement of RF voltages, RF currents or DC biases. The circuit boards are secured within a circuit board housing 129 by first 130 and second 132 sets of slotted set screws (the circuit board housing 129 is shown in greater detail in FIGS. 12-13), it being understood that various other fastening means could also be employed for this purpose.

The circuit boards typically contain the necessary components to perform the desired signal analysis. In the particular embodiment depicted, the RF sensor is shown equipped with two circuit boards. However, in some embodiments, the circuitry of the RF sensor may be condensed into a single circuit board, while in other embodiments, three or more circuit boards may be utilized. The number of circuit boards employed in a given embodiment may be driven by such considerations as ease of manufacture and repair, heat dissipation, shielding, and the functionalities to be provided by the sensor.

Figure 9:
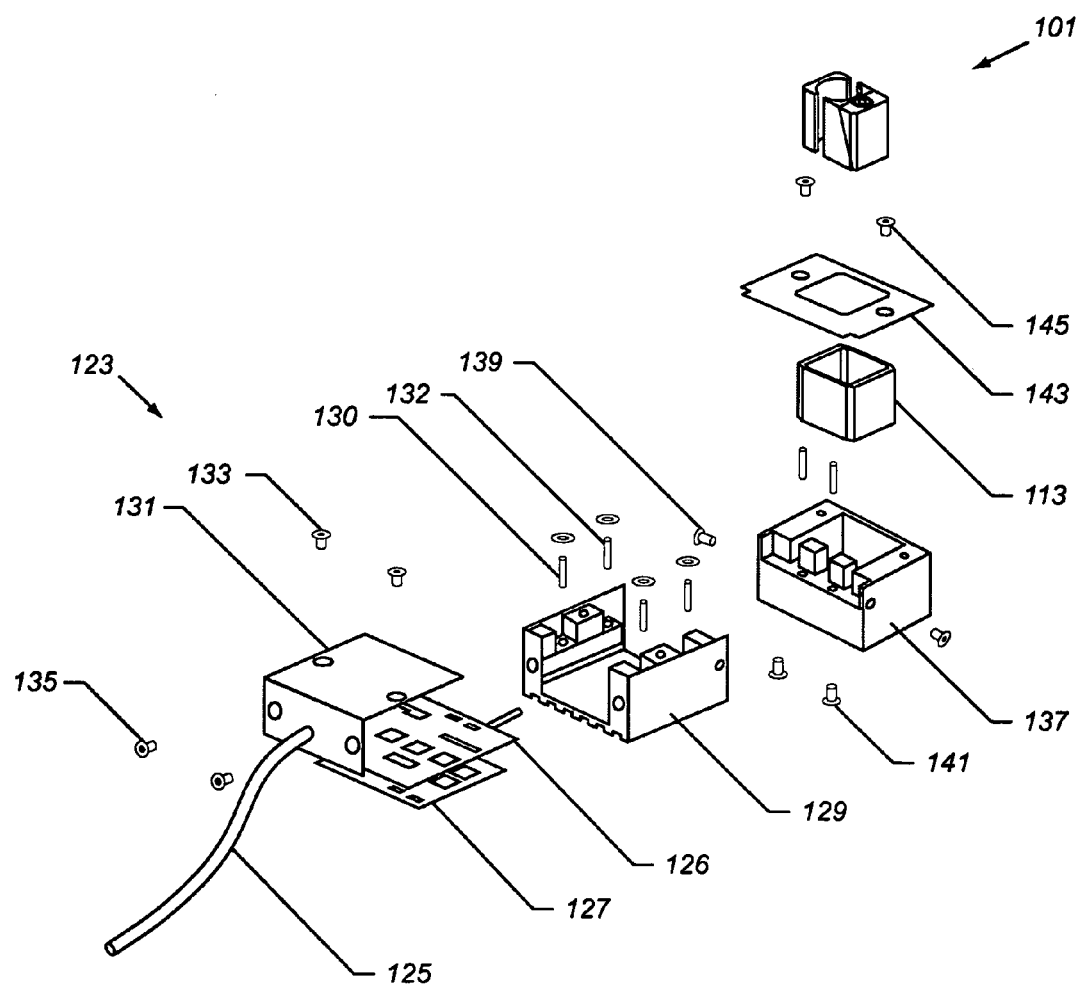
FIGS. 9-10 are exploded perspective views of the RF sensor of FIG. 8.
Figure 10:
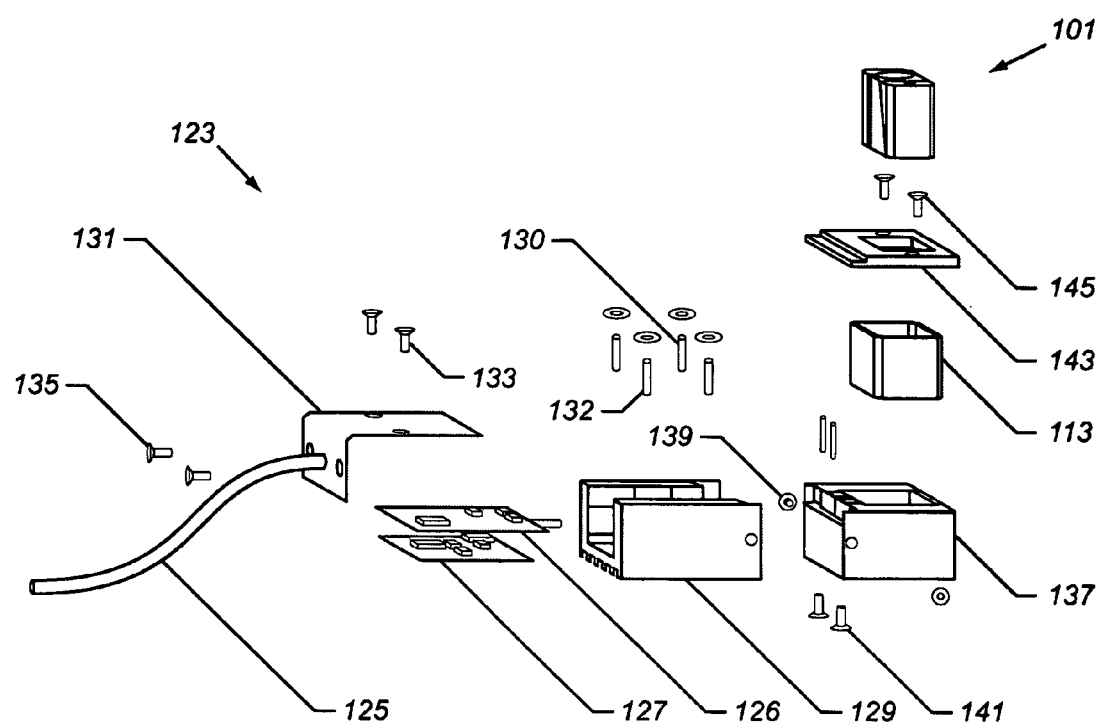
Figure 11:
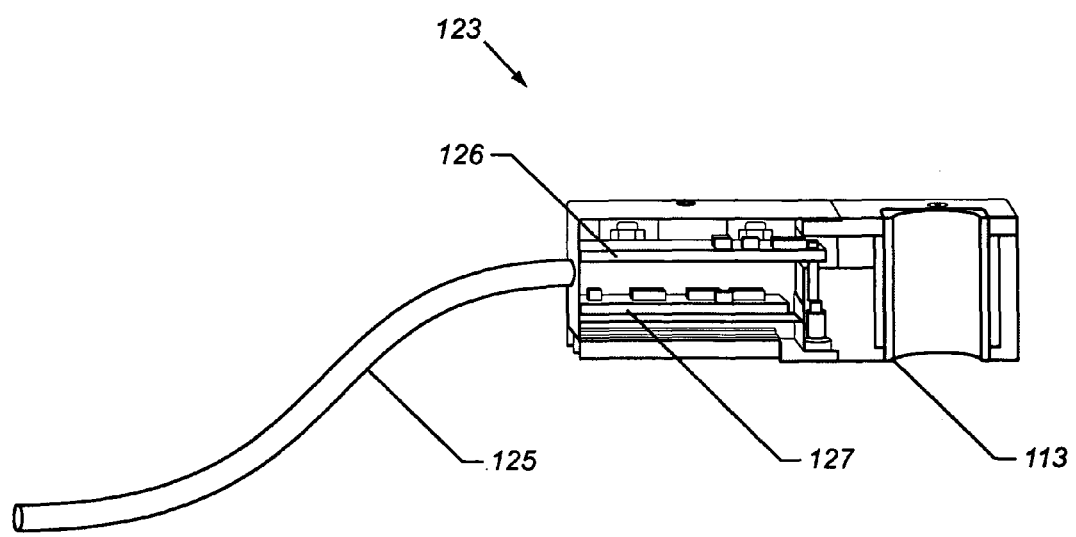
FIG. 11 is a cross section taken along Line 11-11 of FIG. 8.
Figure 12:
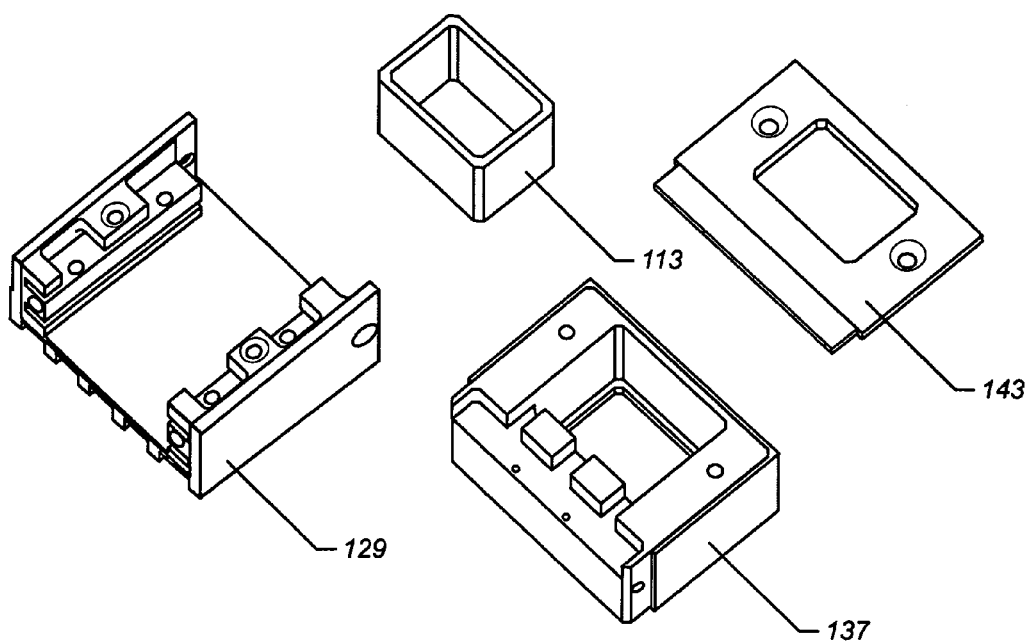
FIGS. 12-13 are perspective views of some of the components of the RF sensor of FIG. 8.
Figure 13:
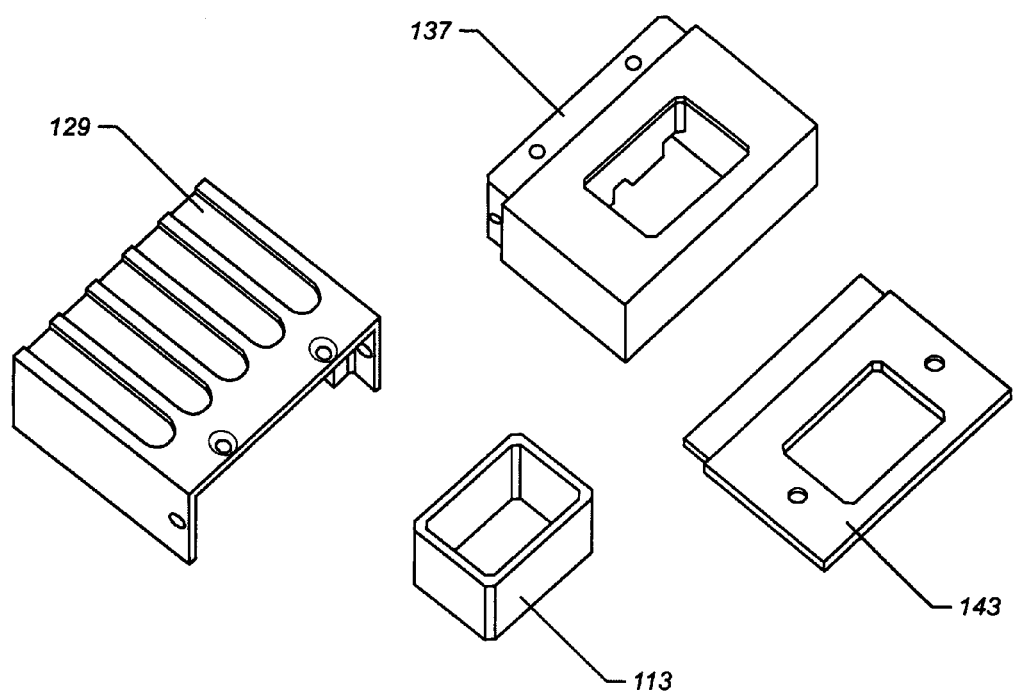
Figure 14:
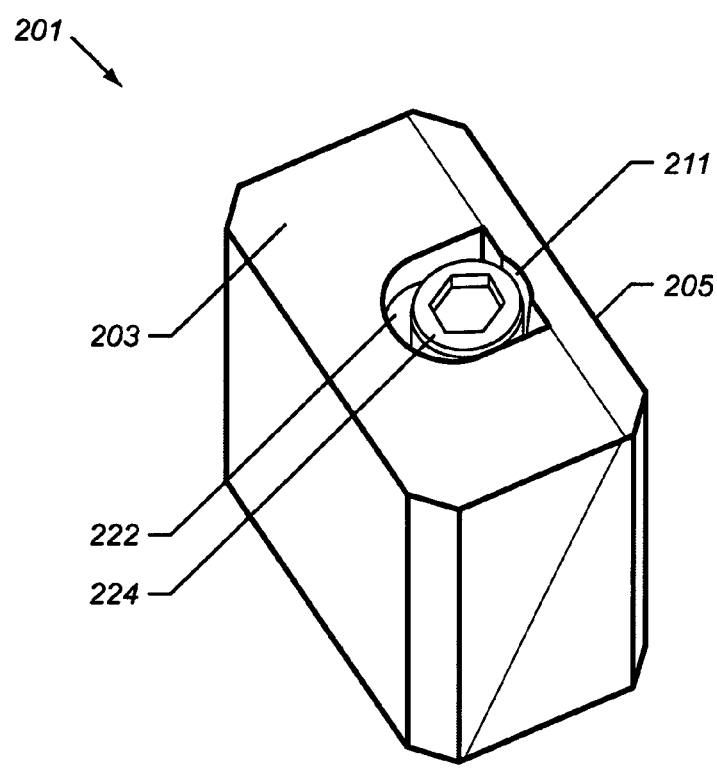
FIG. 14 is a perspective view of a second embodiment of an RF sensor clamp assembly made in accordance with the teachings herein.

A first cover plate 131 is provided to protect the circuit boards from the ambient environment. Various materials can be used for the cover plate, with the ultimate selection typically depending upon such considerations as magnetic shielding, ease of manufacture, durability, and the like. As seen in FIGS. 8-10, the first cover plate 131 is secured to the circuit board housing 129 by way of first 133 and second 135 sets of socket countersunk head cap screws, though other suitable fastening means may also be employed for this purpose.

The clamp assembly 101 and collar 113 are disposed within a vespel housing 137 (shown in greater detail in FIGS. 12-13), which is attached to the circuit board housing 129 by way of first 139 and second 141 pairs of socket countersunk head cap screws (see FIGS. 9-10). A second cover plate 143 (shown in greater detail in FIGS. 12-13) is provided which is attached to the vespel housing 137 by way of a pair of socket countersunk head cap screws 145. Again, other suitable fastening means may be employed in place of, or in addition to, any of the head cap screws 139, 141 and 145.

Referring again to circuit boards 126 and 127 (see FIGS. 9-11), in addition to performing the desired signal analyses, in some embodiments, the circuit boards may also comprise one or more memory chips or built-in memory devices which store calibration information that may be used in the signal analysis. Such analysis typically includes Fast Fourier Transfer (FFT) signal analysis, which may be implemented as a firmware algorithm. However, the particular embodiment depicted does not rely upon a firmware algorithm in the DSP chip for the FFT implementation. Rather, it utilizes a pseudo-hardware implementation of the FFT resident on the circuit boards in the form of paradigm circuitry. Consequently, in this embodiment, the memory function is resident in the DSP device itself. Of course, one skilled in the art will appreciate that various embodiments are possible which utilize other FFT implementations or approximations, including hardware, software and firmware implementations, and that various combinations of such implementations or approximations are also possible.

The pseudo-hardware implementation of the FFT as described above, and in particular the implementation of the FFT by hardware rather than software or firmware, is particularly advantageous in high frequency applications, such as applications at 300 MHz or above. At these frequencies, a software implementation of the FFT can become onerous or impractical due to sampling rate requirements. Thus, for example, in order to digitize the wave form in a 300 MHz signal as required to perform the FFT, it would be necessary to sample at a minimum of 600 MHz. Such a sampling rate is challenging to implement with currently available technology. Moreover, even if such a sampling rate is utilized, the resolution (i.e., bit depth) afforded by commonly available Analog to Digital Converters (ADCs) is very poor (about 2-3 bits), and the computational assets required are significant.

One possible solution to this problem is to incorporate heterodyne circuitry into the circuit boards 126, 127. This circuitry uses mixer technology to frequency shift the signal down to lower frequencies. A number of ADCs are presently available that provide sufficient resolution at the output frequencies of the heterodyne circuitry, and hence can be used in conjunction with this circuitry to implement the FFT. However, in the preferred embodiment, the FFT is implemented by a hardware solution that operates in conjunction with the heterodyne circuitry. This hardware solution discretely monitors the amplitudes and phases of each frequency, and thus avoids the need for an ADC prior to implementation of the FFT.

Figure 21:
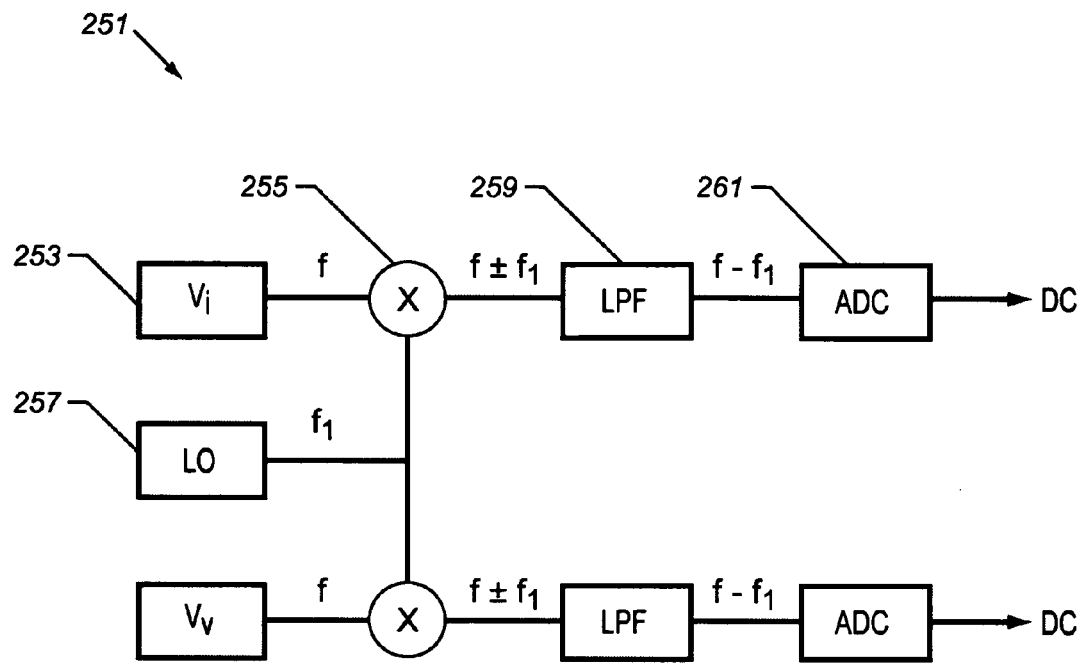
FIG. 21 is a schematic diagram of one possible embodiment of the signal analysis hardware that may be used in the sensors described herein.
Figure 22:
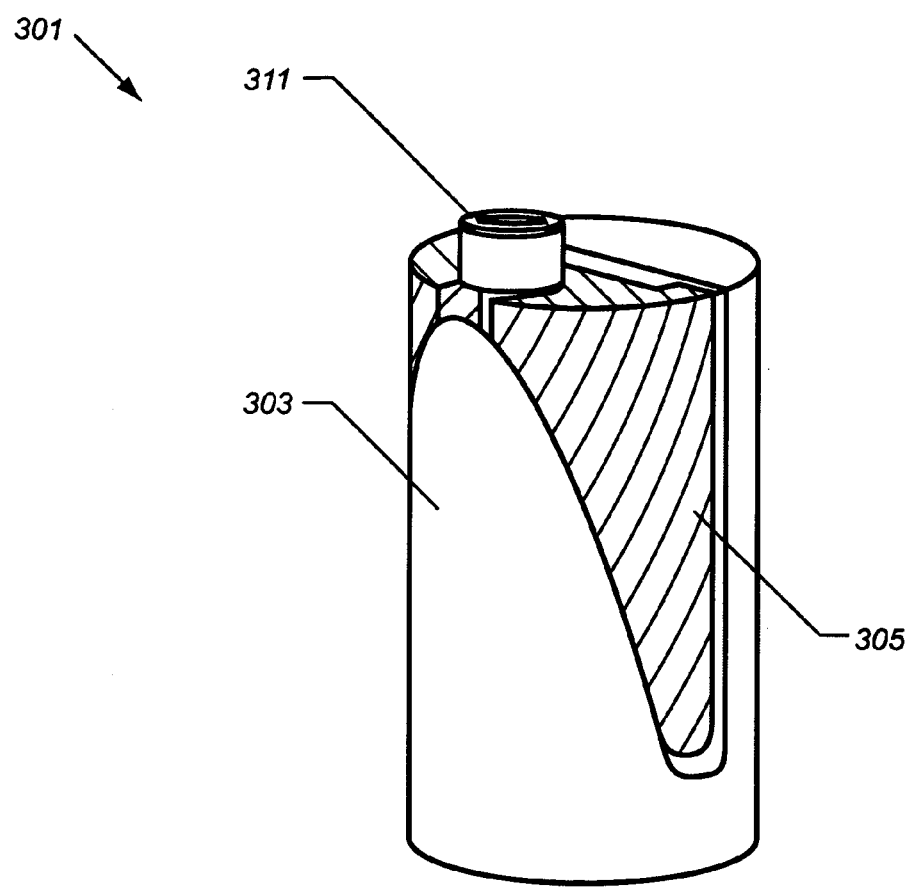
FIGS. 22-23 and 25 are perspective views of a second embodiment of an RF sensor clamp assembly made in accordance with the teachings herein.
Figure 23:
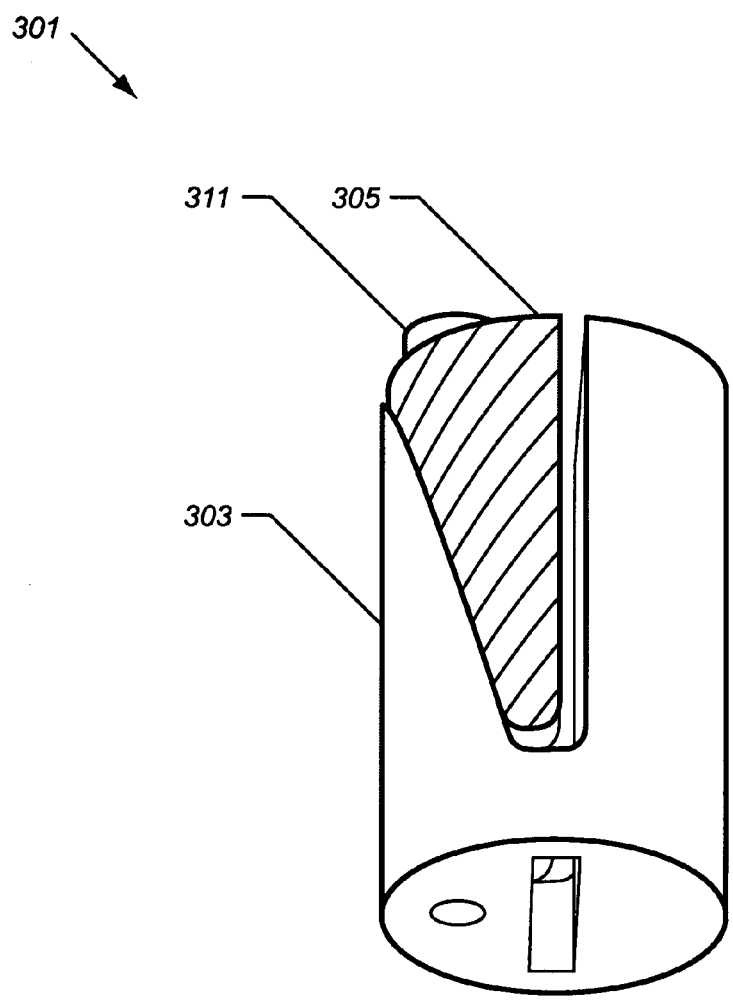
Figure 24:
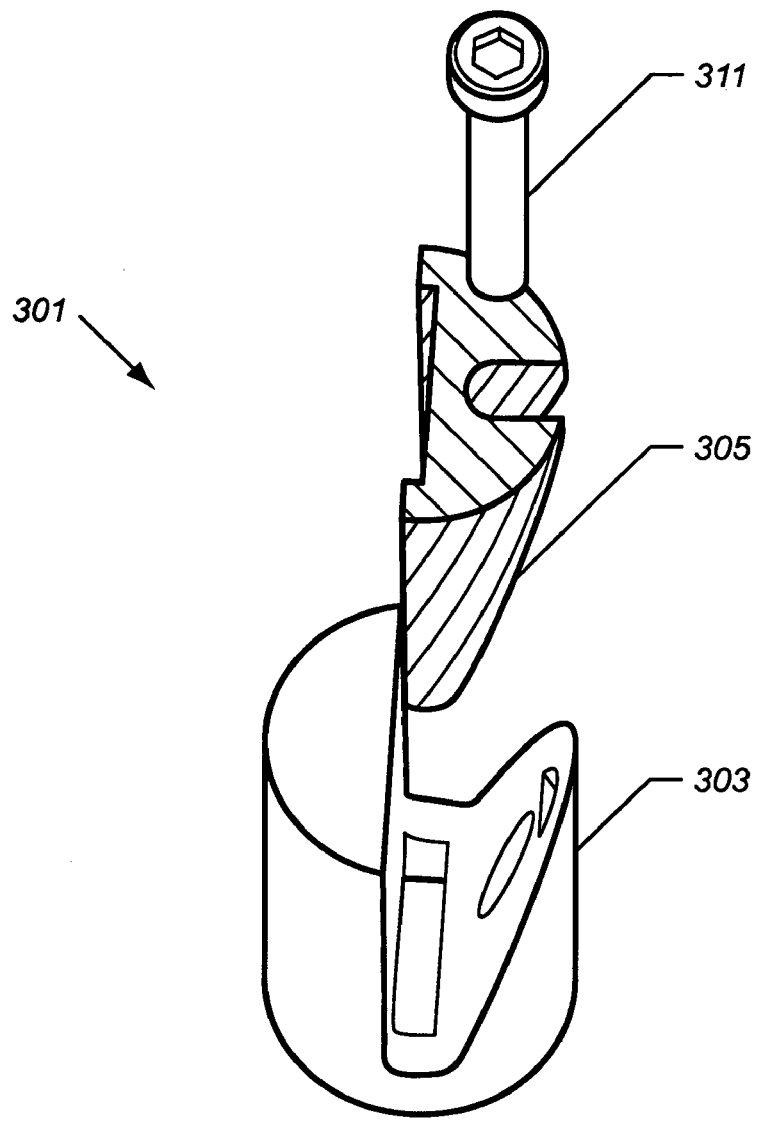
FIG. 24 is an exploded perspective view of the RF sensor clamp assembly depicted in FIGS. 22-23 and 25.
Figure 25:
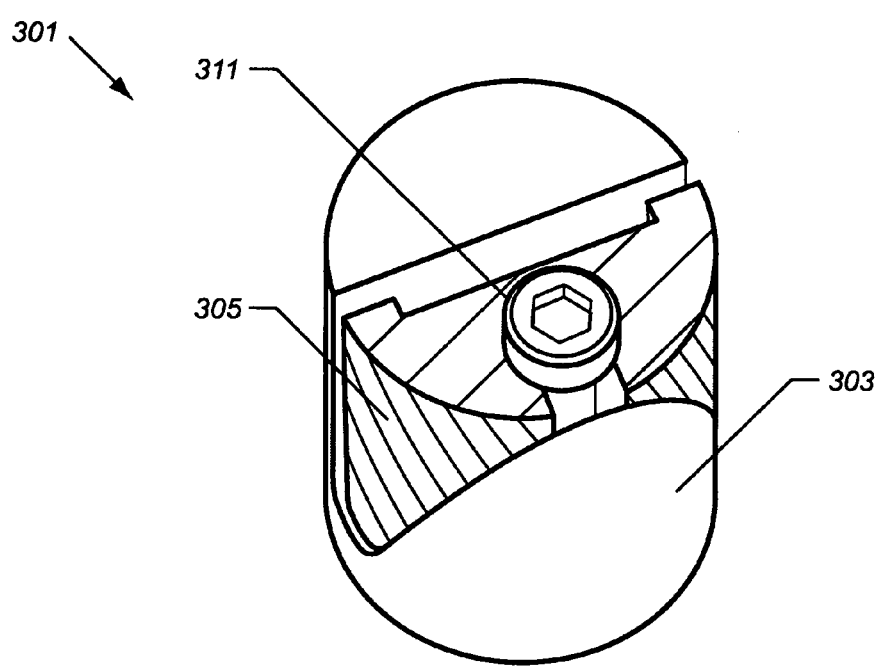
Figure 26:
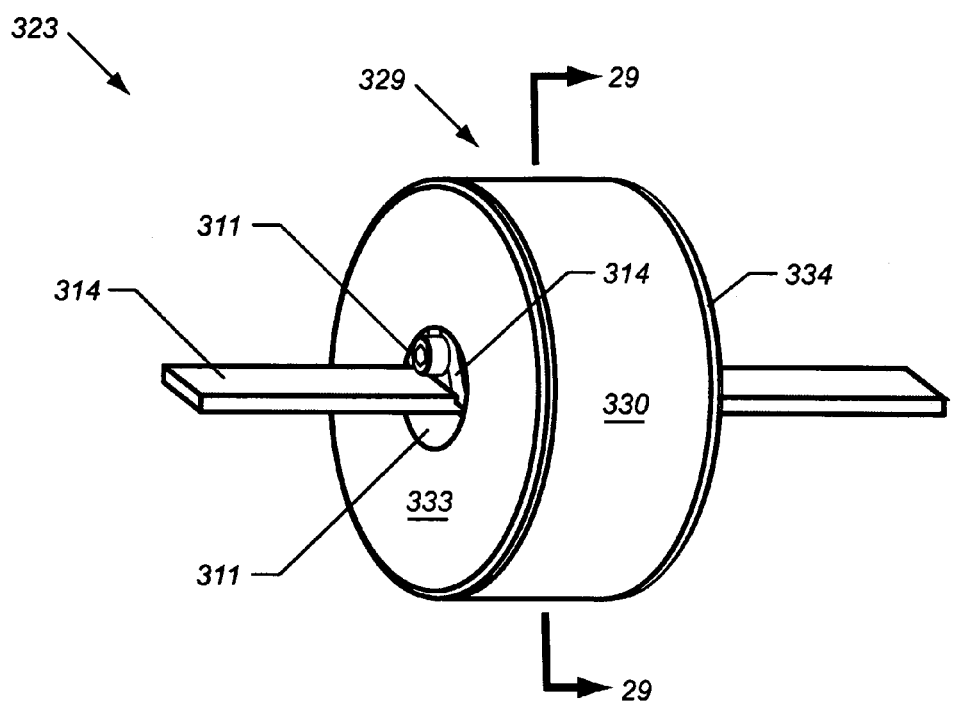
FIG. 26 is a perspective view of an RF sensor made in accordance with the teachings herein which incorporates the RF sensor clamp assembly of FIGS. 22-23 and 25.
Figure 27:
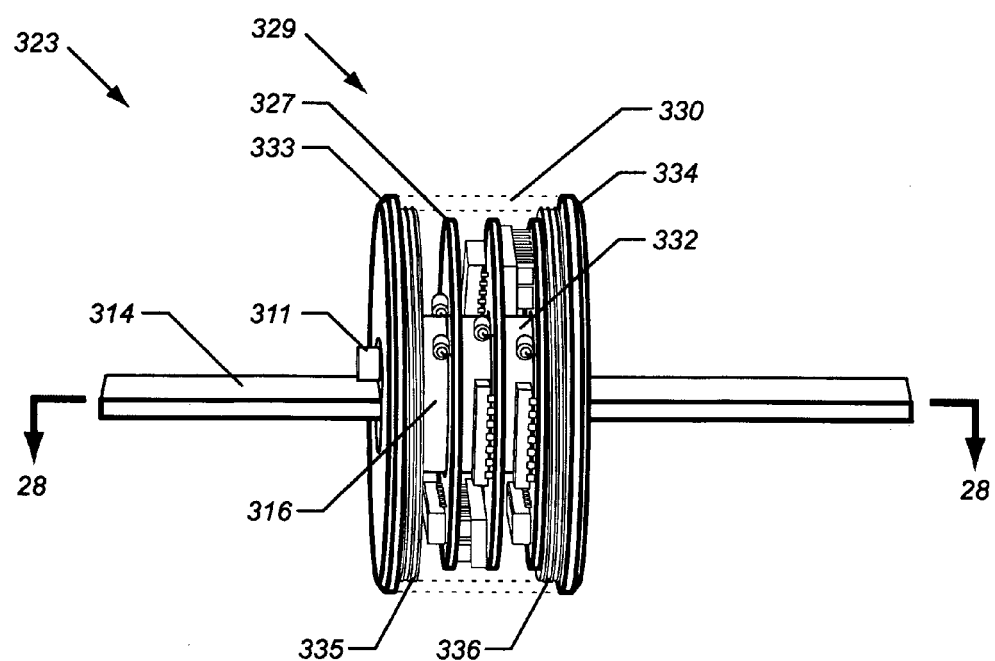
FIG. 27 is a perspective view of the RF sensor of FIG. 26 with the outer wall removed to show the details of the interior of the device.

FIG. 21 is a schematic illustration of the basic functionality of the signal analysis hardware 251 described above. The hardware 251 comprises a plurality of transducers 253, each of which provides a frequency f of about 300 MHz to a respective mixer 255. The transducers share a local oscillator 257 which generates a signal $f_1$ on the circuit board. Each mixer outputs two signals $f \pm f_1$. The signals $f \pm f_1$ are then routed through a low pass filter 259 which outputs a signal $f - f_1$, where $f_1$ is chosen to be sufficiently close to f such that the difference $f - f_1$ is small (e.g., about 40 KHz). The signal is then passed through an ADC 261 for conversion into a digital signal. The hardware may also include other elements as are known to the art, such as signal amplifiers and clocks. The signal input to the hardware is a broadband signal. By tuning the local oscillator and utilizing a low pass filter, the hardware is able to scan through frequency space to any frequency of interest.

With reference again to FIGS. 9-11, circuit board 126 in this particular embodiment is a transducer board. The transducer board typically comprises a DC bias transducer, a current transducer, a voltage transducer, and a lead programmable gain amplifier. The transducer board also typically contains the circuitry necessary to input the signals from the transducers at the proper gains. Circuit board 127 in this embodiment is an analog board that typically contains mixing devices (these include not only mixers, but low pass filters and ADCs as shown in FIG. 21), DSP chips, memory chips or devices, and a Direct Digital Synthesizer (DDS) that sets the local oscillator signal. The DSP chip communicates to the outside world (preferably via a 485 interface, though other suitable interfaces may also be utilized), while also controlling the programmable gain amplifiers and the digitization. The DSP chip also controls the DDS, which in turn controls the local oscillators.

The DSP chip also typically handles calibration of the digital signal output by the hardware depicted in FIG. 21. In particular, in the specific embodiment depicted, the DSP chip utilizes the frequency input into the mixer, and the attenuational gain constants retrieved from the memory chip located on the analog circuit board 127, to calibrate the digital signal output by the hardware ADC. This calibrated, digital signal is then transmitted over the (preferably 485) interface. If a 485 interface is utilized, a converter may be provided to convert this signal from 485 to Ethernet.

It will be appreciated from the above discussion that one of the beneficial attributes of some of the devices disclosed herein is the pairing of the transducer package with a memory device that is capable of storing calibration coefficients that correspond to the transducer package. This avoids the need for recalibration in the event that the transducer package must be replaced.

Preferably, the transducer package and memory device are disposed near each other, and even more preferably, the two elements are disposed on the same PCB. However, various embodiments are also possible where this is not the case. For example, embodiments are possible where the memory device is disposed remote from the transducer package. In such embodiments, the memory device will typically be in communication with the signal processing hardware by a hardwire link, through a wireless connection, or by other suitable means. Embodiments are also possible where there is no specific memory device per se, but the calibration coefficients are transmitted, or otherwise made available to the signal processing hardware or software, on an as-needed basis.

FIGS. 14-17 depict a second embodiment of a clamp assembly useful in the RF sensors disclosed herein when the sensors are used in conjunction with bar-shaped current carriers. The clamp assembly 201 features first 203 and second 205 wedge inserts that slidingly engage each other across first 207 and second 209 opposing surfaces (see, e.g., FIG. 15) by means of a suitable (and preferably releasable) fastener, such as a socket head cap screw 211. As the cap screw is tightened (typically by rotating it in a clockwise manner), the assembly of the first 203 and second 205 wedge inserts expands. Conversely, as the cap screw is loosened (typically by rotating it in a counterclockwise manner), the assembly of the first 203 and second 205 wedge inserts contracts or relaxes.

Figure 16:
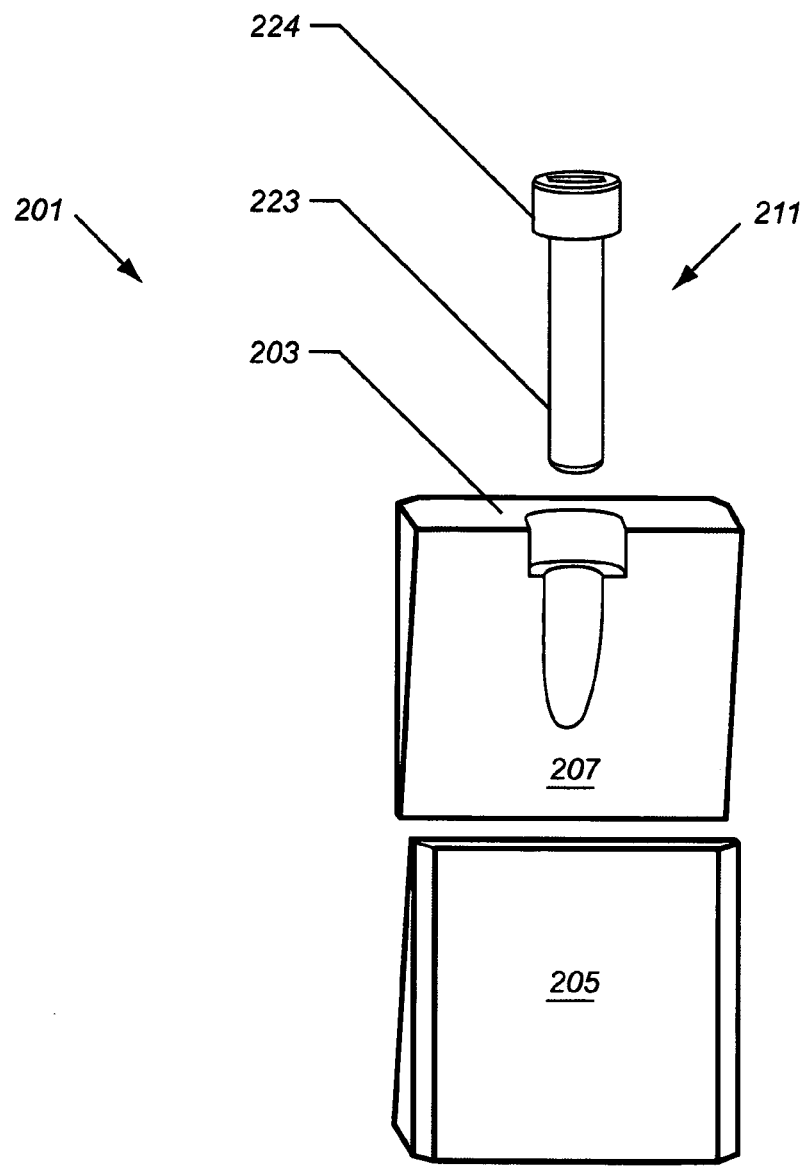
Figure 17:
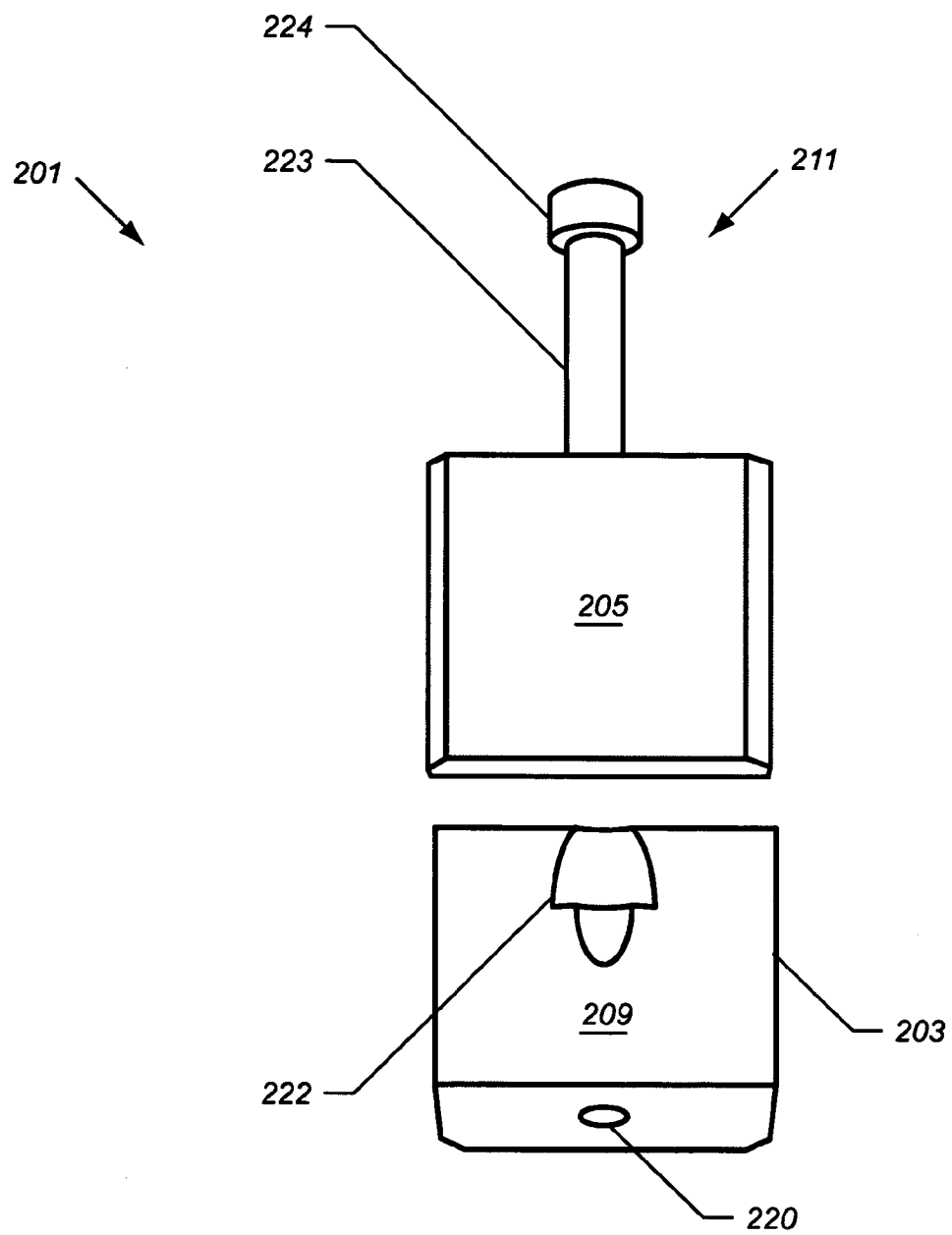

Although not specifically shown, the cap screw preferably has a threaded surface on its shaft 223 (see FIGS. 15-17) that rotatingly engages complimentary threads provided on the surfaces of aperture 220 that extends through wedge inserts 203 and 205. The cap screw is also provided with a cap 224 that halts the progress of the screw in the axial direction when the cap abuts a ledge 222 defined in aperture 220 (see FIG. 15). As shown in FIG. 17, the aperture 220 may extend through the bottom of wedge insert 203 to permit the egress of metal shavings or other debris that may accumulate in the aperture from time to time.

In use, the clamping assembly 201 is disposed within a collar 213 (see FIGS. 19-20) and is placed on one side of the bar-shaped current carrier (not shown). As the cap screw is tightened (typically by rotating it in a clockwise manner), the clamping assembly expands and presses the bar-shaped current carrier against the collar 213, thus firmly gripping the surface of the current carrier and connecting it to the RF sensor. Similarly, as the cap screw is loosened (typically by rotating it in a counter-clockwise manner), the clamping assembly loosens or contracts, thus releasing the current carrier.

Figure 18:
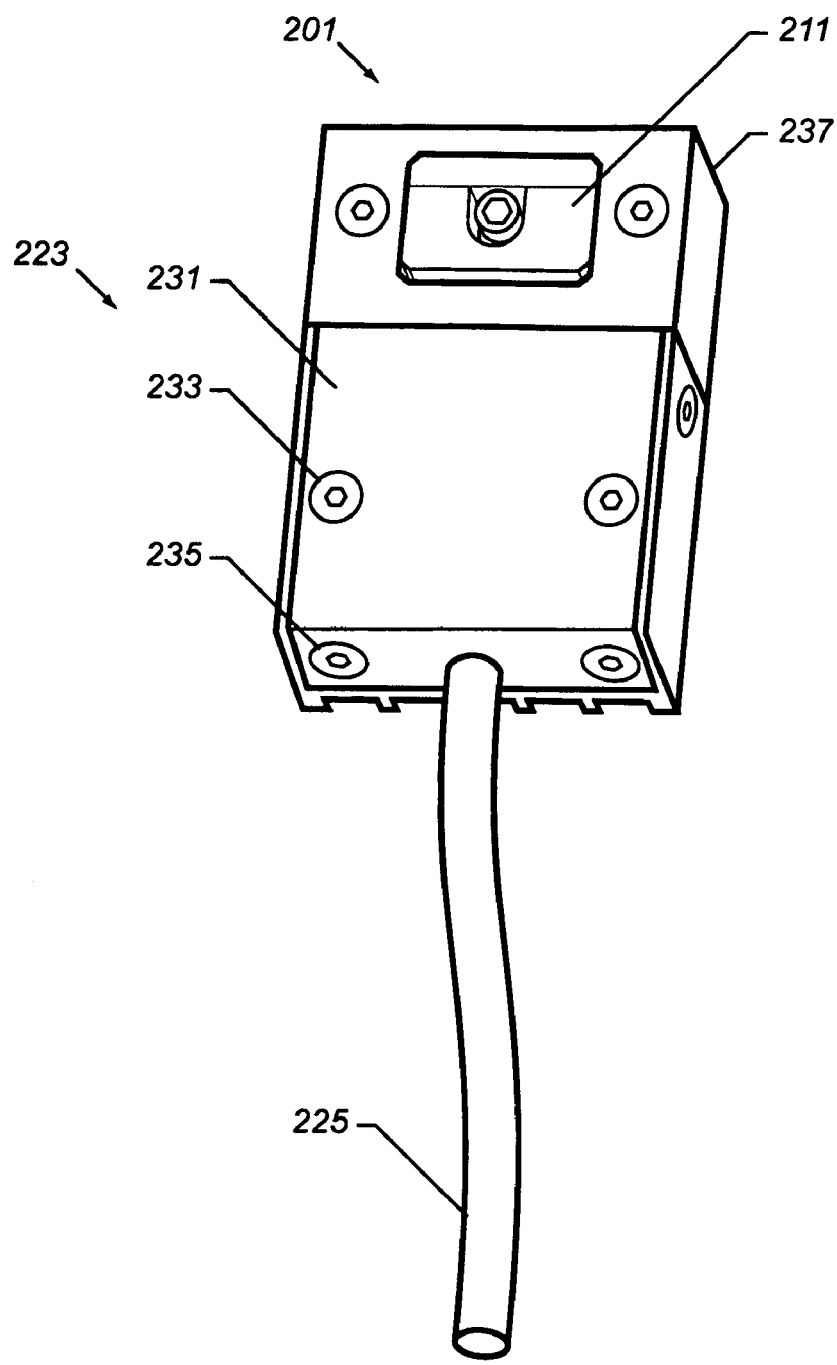
FIG. 18 is a perspective view of an RF sensor made in accordance with the teachings herein which incorporates the RF sensor clamp assembly of FIG. 14.
Figure 19:
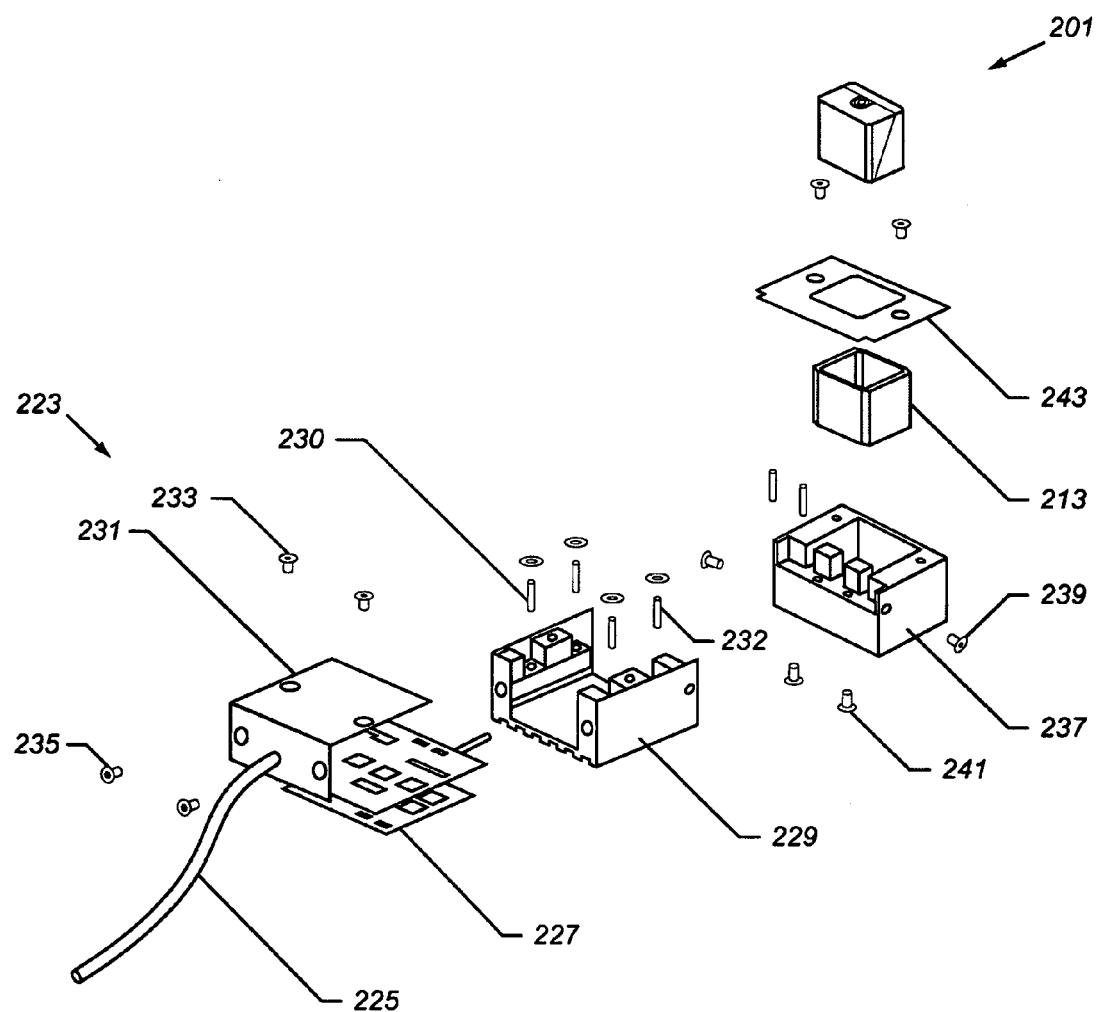
FIGS. 19-20 are exploded perspective views of the RF sensor of FIG. 18.
Figure 20:
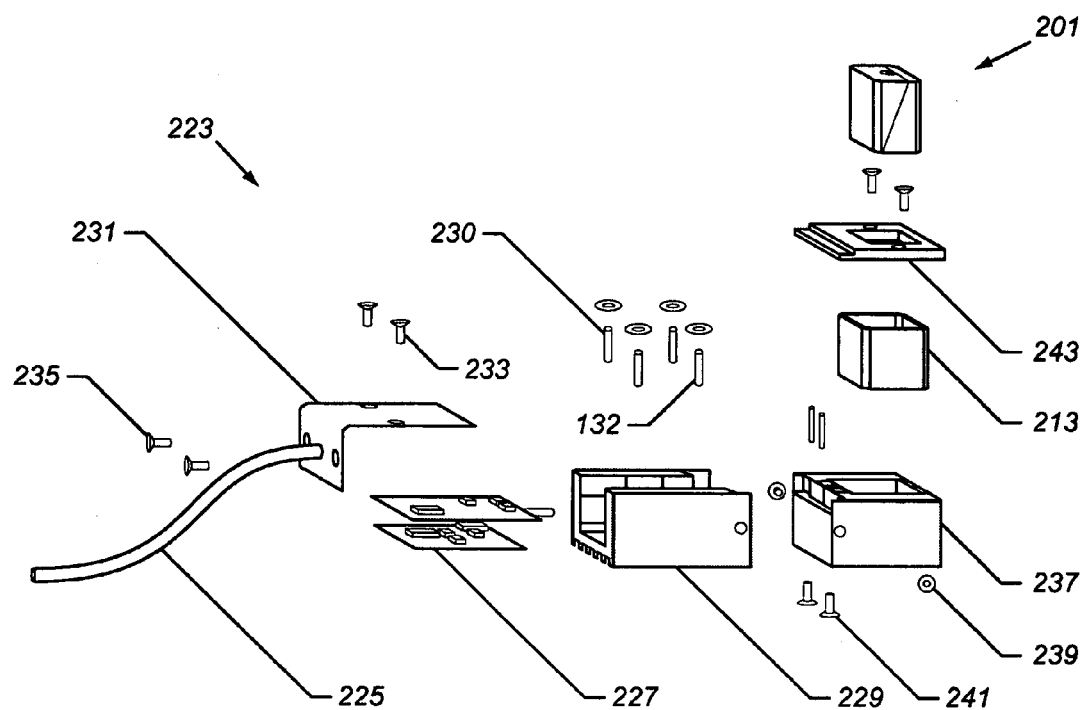

FIGS. 18-20 show different views of the complete RF sensor 223 that incorporates the clamp assembly of FIGS. 14-17. The RF sensor 223 includes a power cord 225 which connects the RF sensor to a source of electrical current. The power cord 225 may have the same features, attributes and functionalities as the power cord of the embodiment depicted in FIG. 8. The sensor also includes a series of (preferably digital) circuit boards 226, 227 which perform the logical functions of the sensor although, as noted in the previously described embodiments, the numbers and functionalities of the circuit boards may vary from one embodiment to the next.

The circuit boards preferably comprise one or more memory chips which store calibration information, and which are secured within a circuit board housing 229 by means of first 230 and second 232 sets of slotted set screws or by other suitable fastening means. The circuit board housing 229 in this embodiment is preferably of the same design as the circuit board housing 129 shown in greater detail in FIGS. 12-13. A first cover plate 231 is provided to protect the circuit boards from the ambient environment. The cover plate 231 is secured to the circuit board housing 229 by way of first 233 and second 235 sets of socket countersunk head cap screws. Of course, one skilled in the art will appreciate that other fastening means may be used in place of, or in conjunction with, any of screws 230, 232, 233 and 235.

Figure 15:
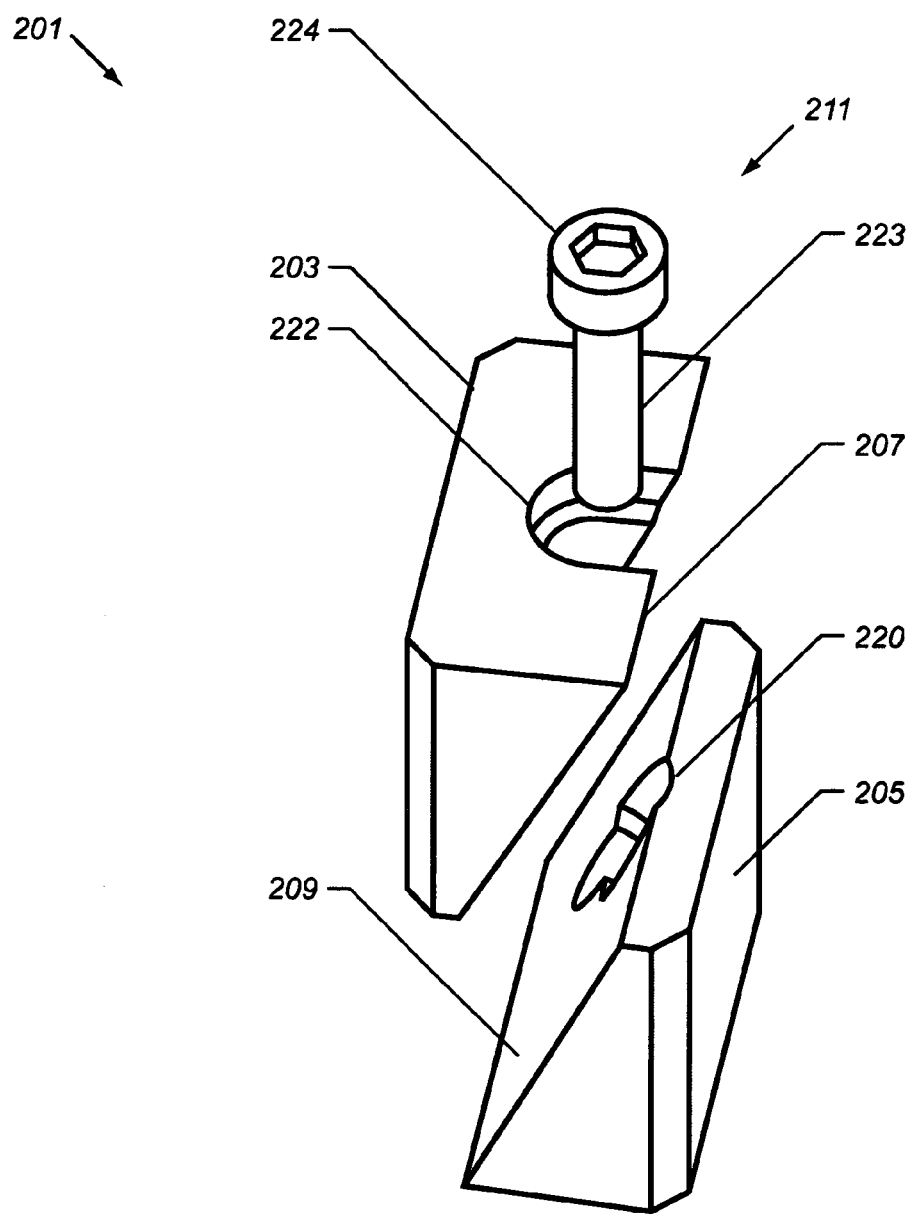
FIGS. 15-17 are exploded perspective views of the RF sensor clamp assembly of FIG. 14.

The clamp assembly 201 and collar 213 are disposed within a vespel housing 237. The vespel housing 237 is preferably of the same design as vespel housing 137 shown in greater detail in FIGS. 12-13, and is attached to the circuit board housing 229 by way of first 239 and second 241 pairs of socket countersunk head cap screws or by other suitable fastening means. A second cover plate 243, which is preferably of the same design as the cover plate 143 shown in greater detail in FIGS. 15-16, is provided and is attached to the vespel housing 237 by way of a pair of socket countersunk head cap screws 245 or by other suitable fastening means.

Figure 29:
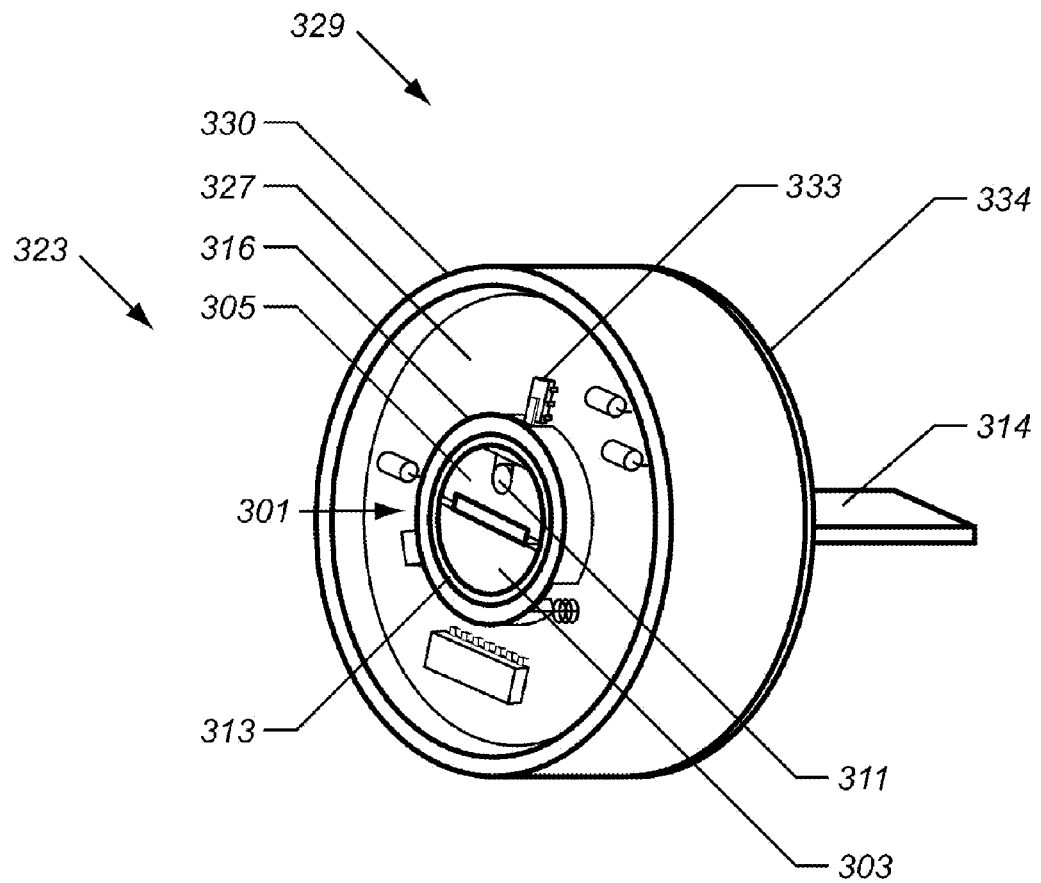
FIG. 29 is a cross-sectional view taken along LINE 29-29 of FIG. 26.

FIGS. 22-25 depict a third embodiment of a clamp assembly useful in the RF sensors disclosed herein when the sensors are used in conjunction with bar-shaped current carriers. The clamp assembly 301 includes a first wedge-shaped element 303 that slidingly engages a second, complimentary shaped wedge-shaped element 305 by means of a suitable fastener (in this particular embodiment, a socket head cap screw 311). As the cap screw is tightened (typically by rotating it in a clockwise manner), the assembly of the first 303 and second 305 elements contracts around the conductor 314 (see, e.g., FIG. 29), thereby securing the clamp assembly (and the associated RF sensor) to the current carrier. Conversely, as the cap screw is loosened (typically by rotating it in a counterclockwise manner), the assembly of the first 303 and second 305 elements relaxes about the conductor, thereby permitting removal of the RF sensor.

In use, the assembly of the first 303 and second 305 elements and the cap screw 311 are disposed within a collar 313 (best shown in FIGS. 29 and 30) and the bar-shaped current carrier 314 (see FIG. 29) is positioned between them. As the cap screw is tightened, the bar-shaped current carrier is pressed between the first 303 and second 305 elements of the clamp assembly, thus firmly gripping it in place. One skilled in the art will appreciate, of course, that in the various embodiments described herein that utilize a collar, the collar may have various designs and implementations, the desired effect being that the collar restricts the expansion of at least one element of the clamp assembly such that the assembly clamps onto the current carrier.

Figure 28:
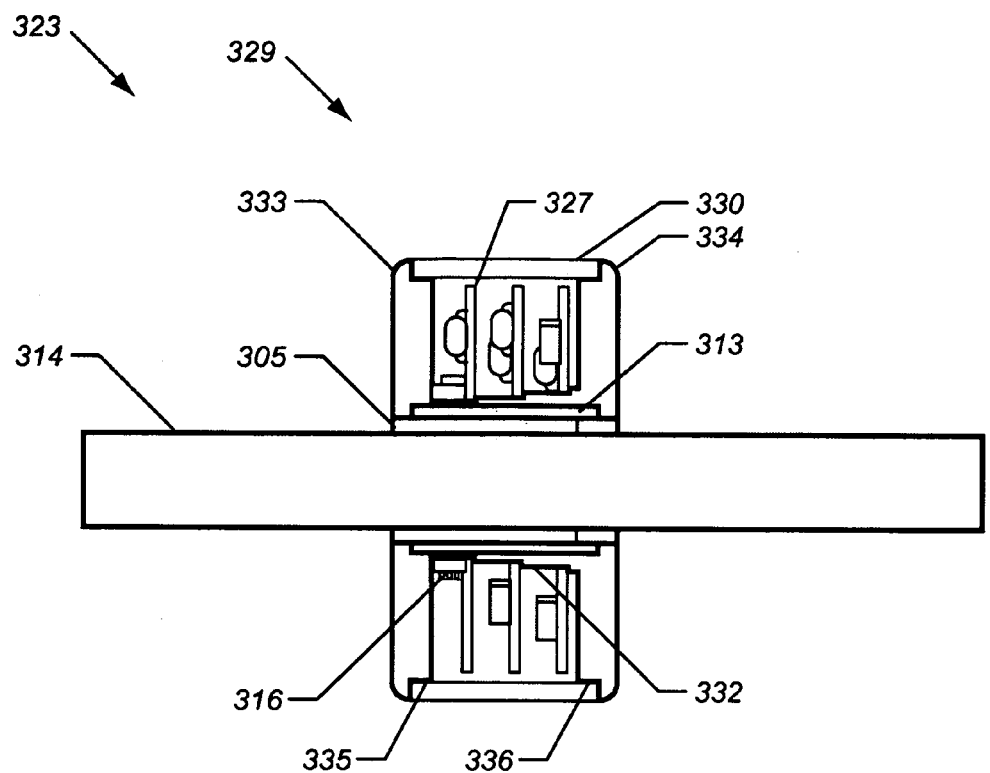
FIG. 28 is a cross-sectional view taken along LINE 28-28 of FIG. 27.
Figure 30:
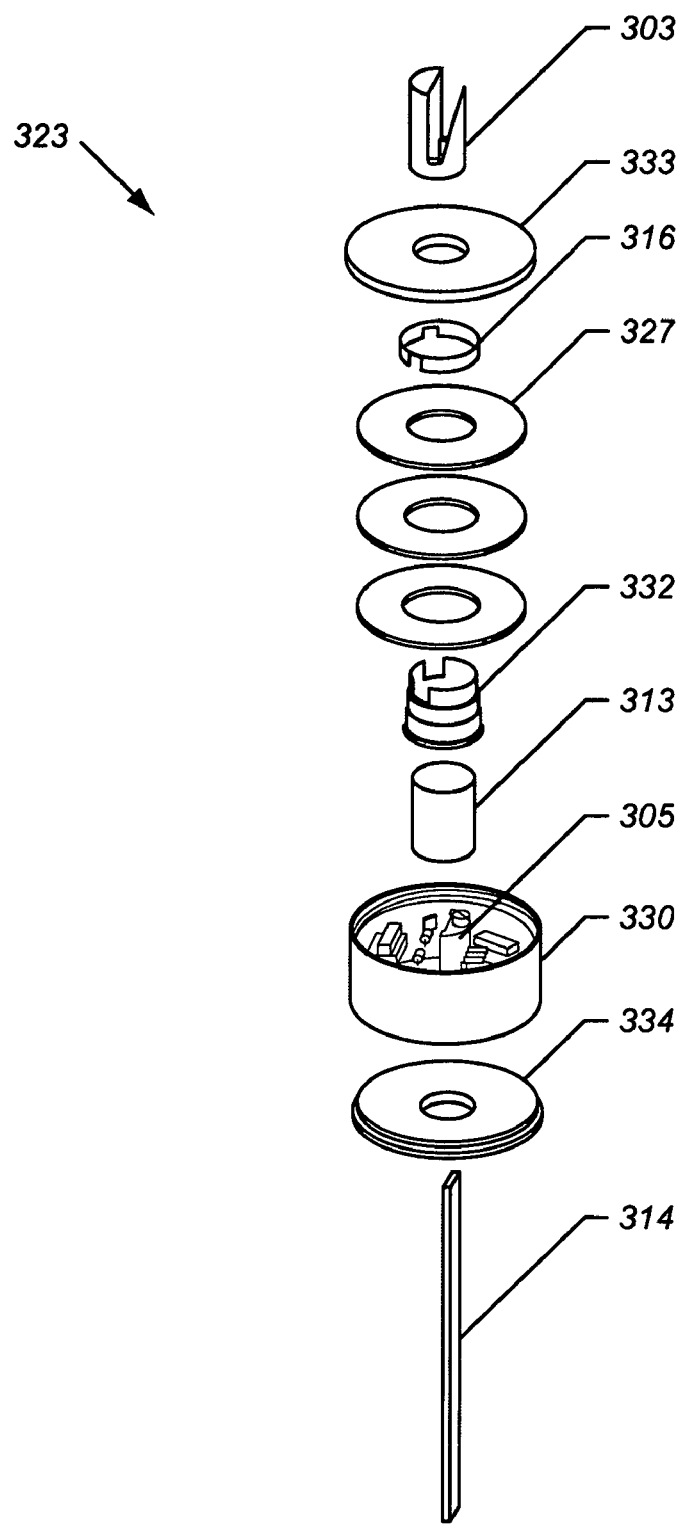
FIG. 30 is an exploded perspective view of the RF sensor of FIG. 26.
Figure 31:
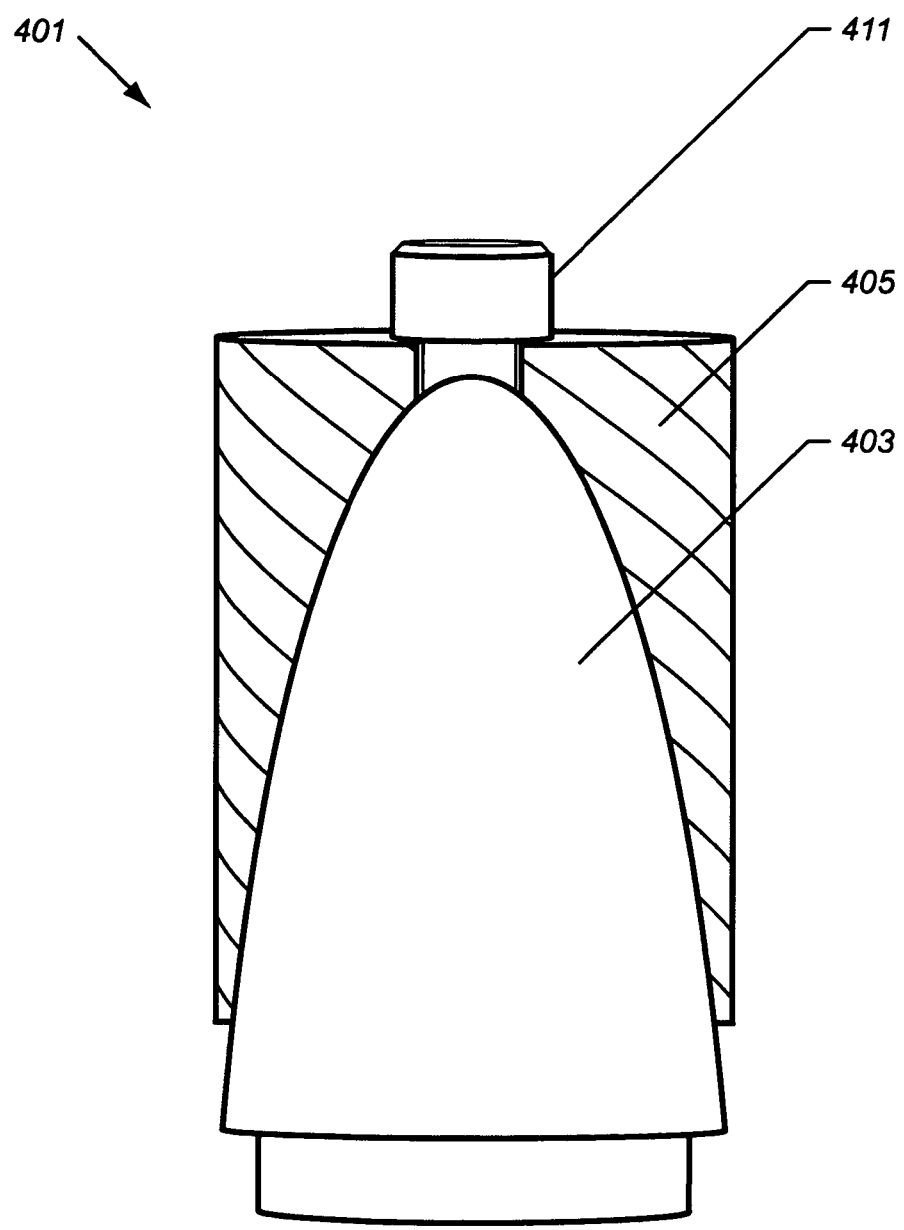
FIGS. 31-32 are perspective views of a third embodiment of an RF sensor clamp assembly made in accordance with the teachings herein.
Figure 32:
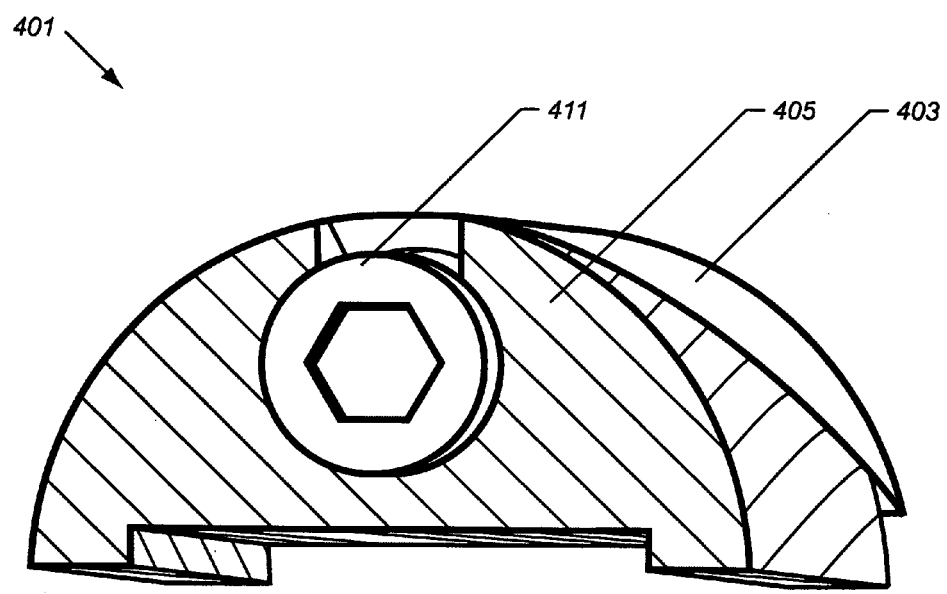
Figure 33:
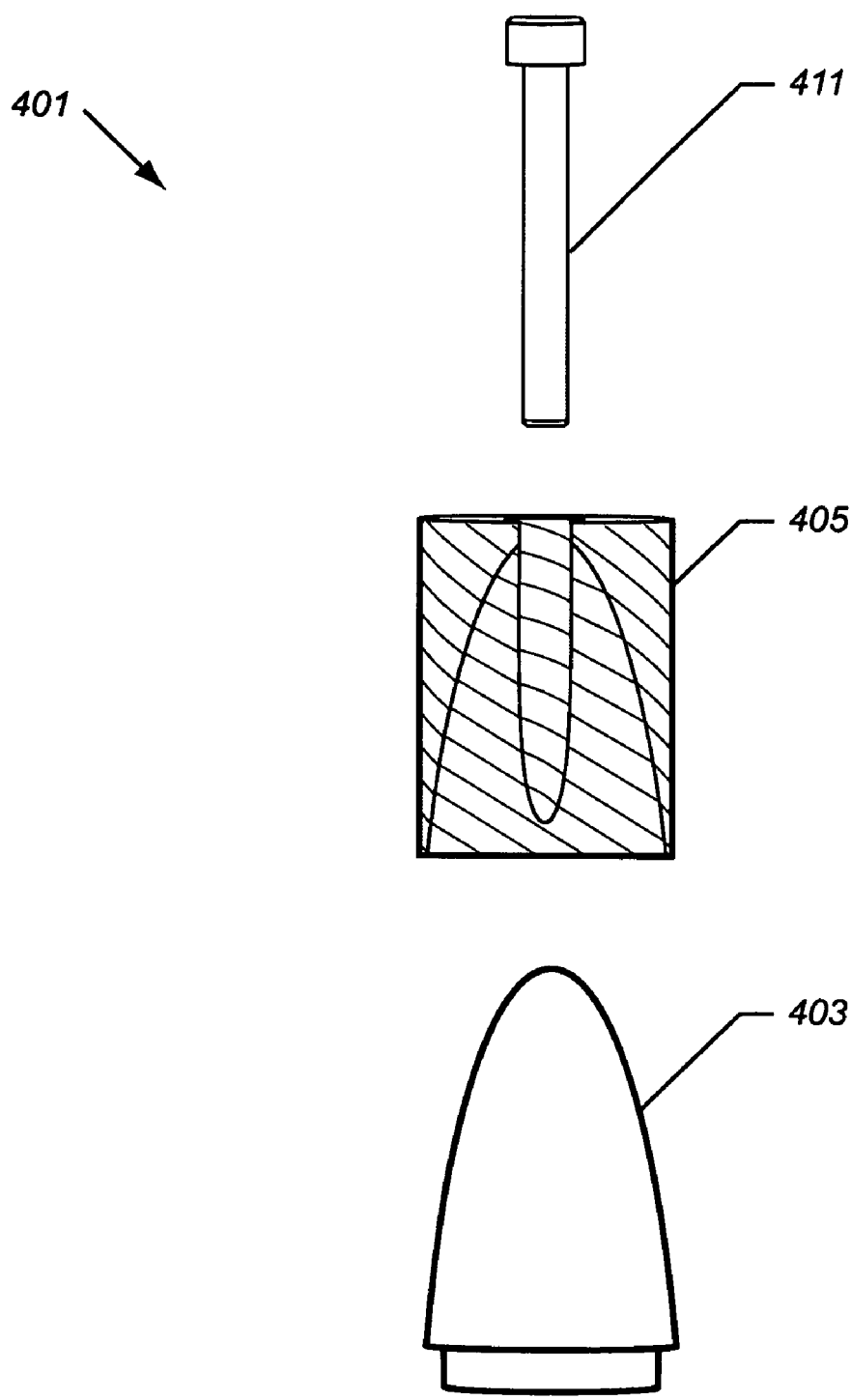
FIGS. 33-34 are exploded perspective views of the RF sensor clamp assembly of FIGS. 31-32.
Figure 34:
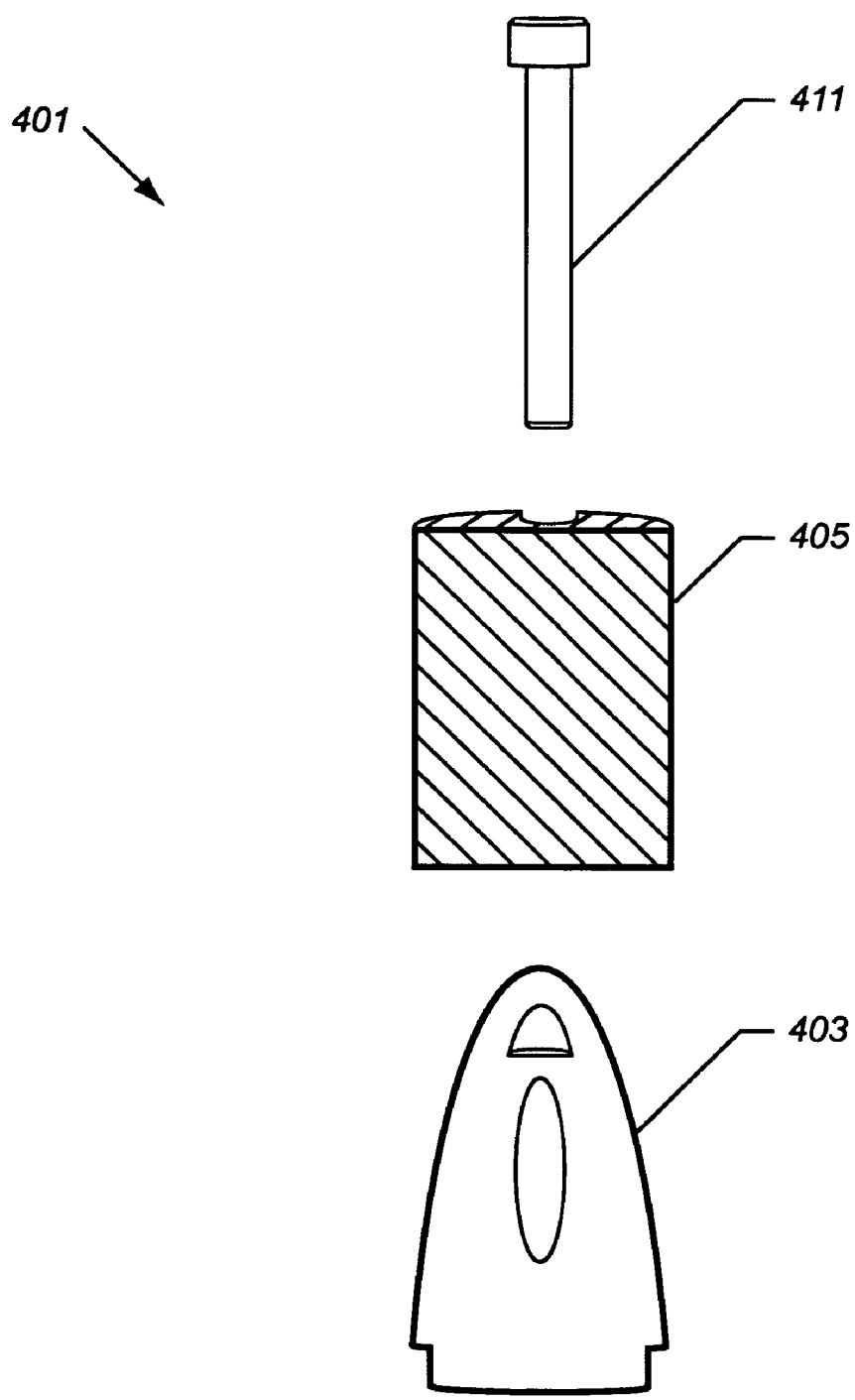
Figure 35:
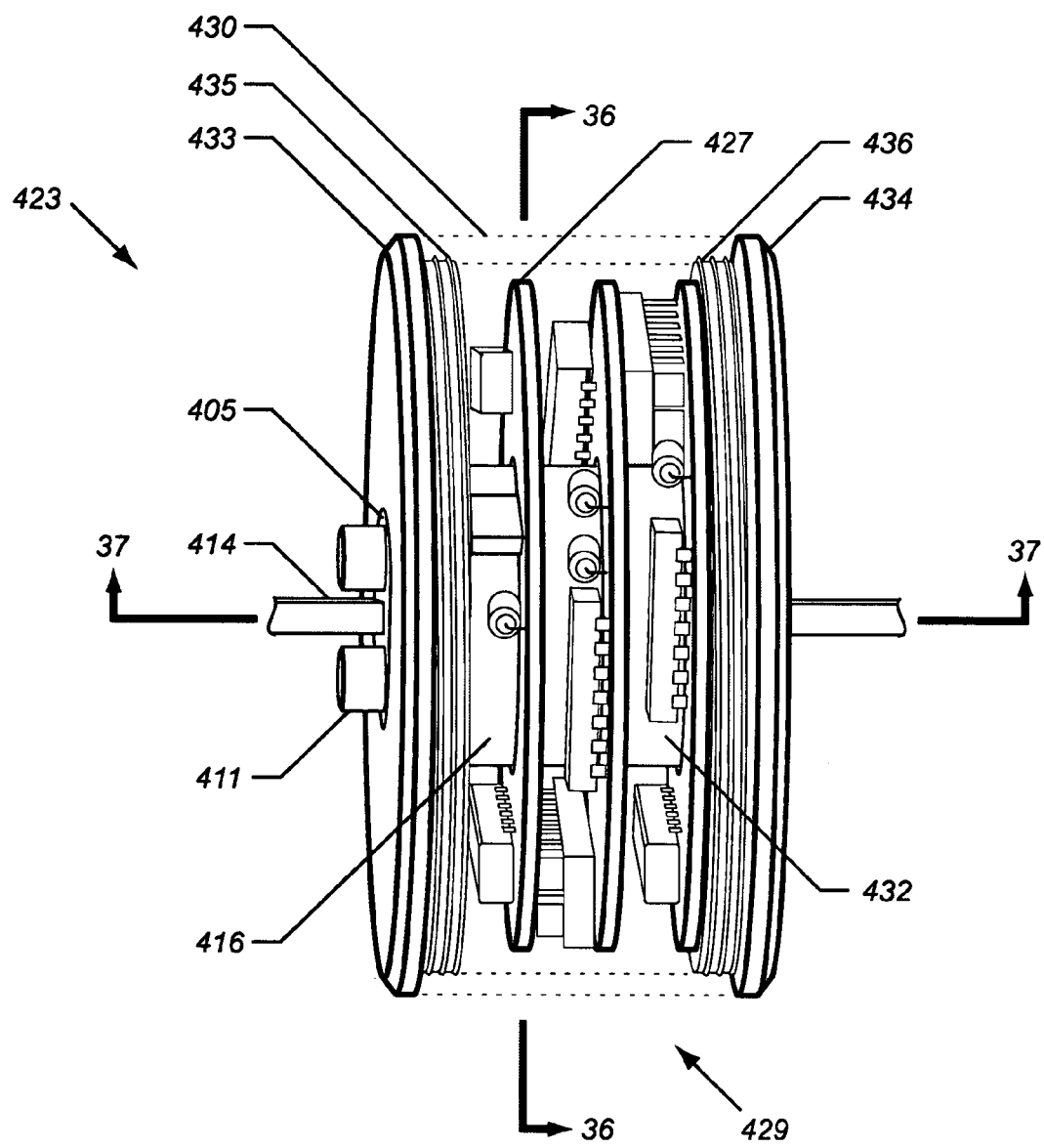
FIG. 35 is a perspective view of an RF sensor made in accordance with the teachings herein which incorporates the RF sensor clamp assembly of FIGS. 31-32 and with the outer wall removed to show the details of the interior of the device.

FIGS. 26-30 show different views of a complete RF sensor 323 that incorporates the clamp assembly of FIGS. 22-25. The RF sensor 323 includes a series of (preferably digital) circuit boards 327 (see FIGS. 27-28 and 30) which perform the logical functions of the sensor. The circuit boards may contain circuitry which is adapted to analyze the at least one attribute of the RF power, and wherein the circuitry is in electrical contact with the clamp assembly 301. In the present embodiment, this is accomplished by way of connector 333, which provides electrical contact between the internal circuitry of the circuit boards 327 and the conductor 314 by way of the clamp assembly 301. The circuit boards may vary in number and design but are preferably functionally equivalent to the circuit boards described in the previous embodiments. One or more of the circuit boards preferably comprises at least one memory chip which stores calibration information. In the particular embodiment depicted, the circuit boards are secured within a circuit board housing 329 defined by the concentric walls of outer housing 330 and inner support 332 (see FIGS. 28 and 29). As seen in FIGS. 28 and 30, inner support 332 is provided with a series of annular ledges that the circuit boards are seated upon. First and second opposing end caps 333, 334 are provided to protect the circuit boards from the ambient environment and to impart structural integrity to the assembly. In this particular embodiment, the end caps 333, 334 are provided with threaded lips 335, 336, respectively (best seen in FIG. 27), each of which rotatingly engages a complimentary set of threads (not shown) defined on the interior surface of outer housing 330 (see FIG. 28).

The clamp assembly 301 and collar 313 (see FIG. 29) are disposed within the outer housing 330. The outer housing 330 has been removed from the RF sensor in FIG. 27 to show the disposition of the circuit boards 327 about the inner support 332 in this embodiment. As seen therein, the circuit boards are annular in shape and are centered about inner support 332. In most other respects, the circuit boards are functionally equivalent to those depicted in the other embodiments described herein.

FIGS. 31-34 depict a fourth embodiment of a clamp assembly useful in the RF sensors disclosed herein when the sensors are used in conjunction with bar-shaped current carriers. The clamp assembly 401 includes a first wedge-shaped element 403 that slidingly engages a second, complimentary shaped receptacle element 405 by means of a suitable fastener, in this case a socket head cap screw 411. In an RF sensor utilizing the clamp assembly, two such clamp assemblies are disposed on opposing sides of a current carrier 414 and are maintained within a sleeve 413 (see FIG. 36). As the cap screw is tightened (typically by rotating it in a clockwise manner), the clamp assembly expands against the sleeve and consequently presses against the conductor. Conversely, as the cap screw is loosened (typically by rotating it in a counterclockwise manner), the clamp assembly relaxes, thus releasing its grip on the conductor.

Figure 36:
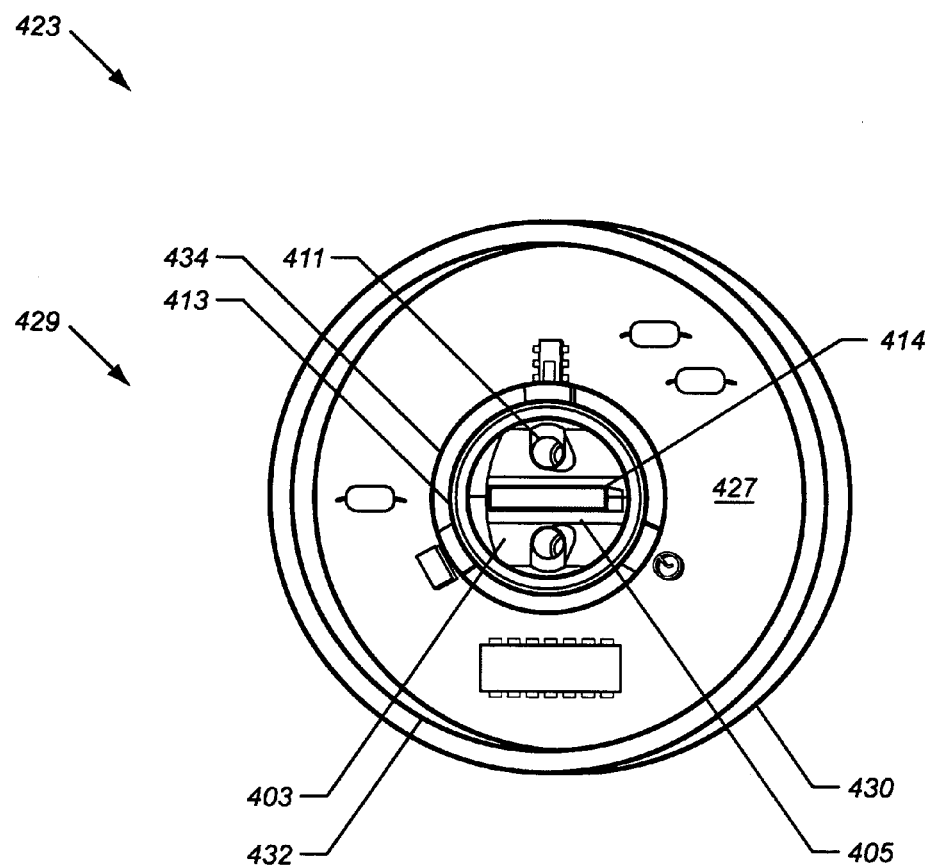
FIG. 36 is a cross-sectional view taken along LINE 36-36 of FIG. 35.
Figure 37:
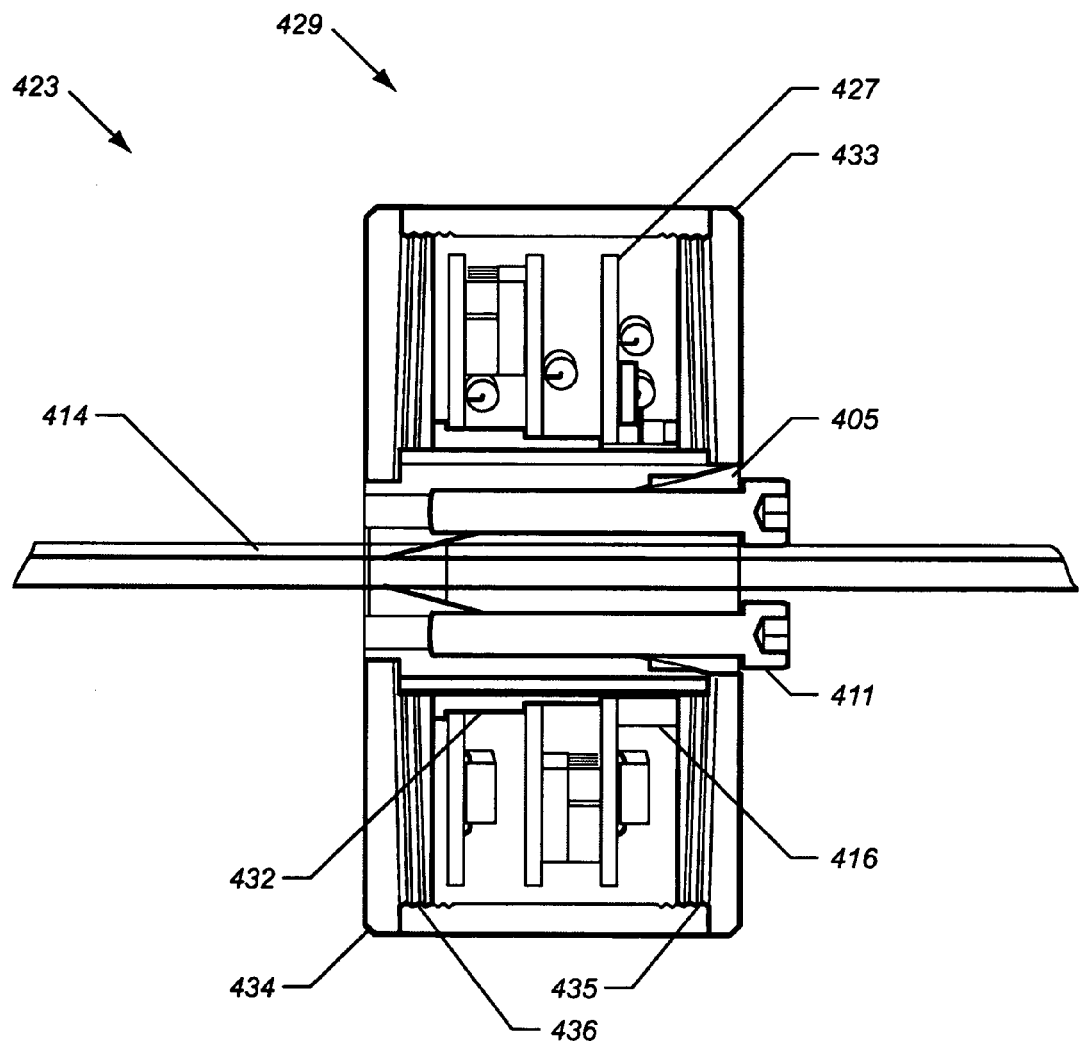
FIG. 37 is a cross-sectional view taken along LINE 37-37 of FIG. 35.
Figure 38:
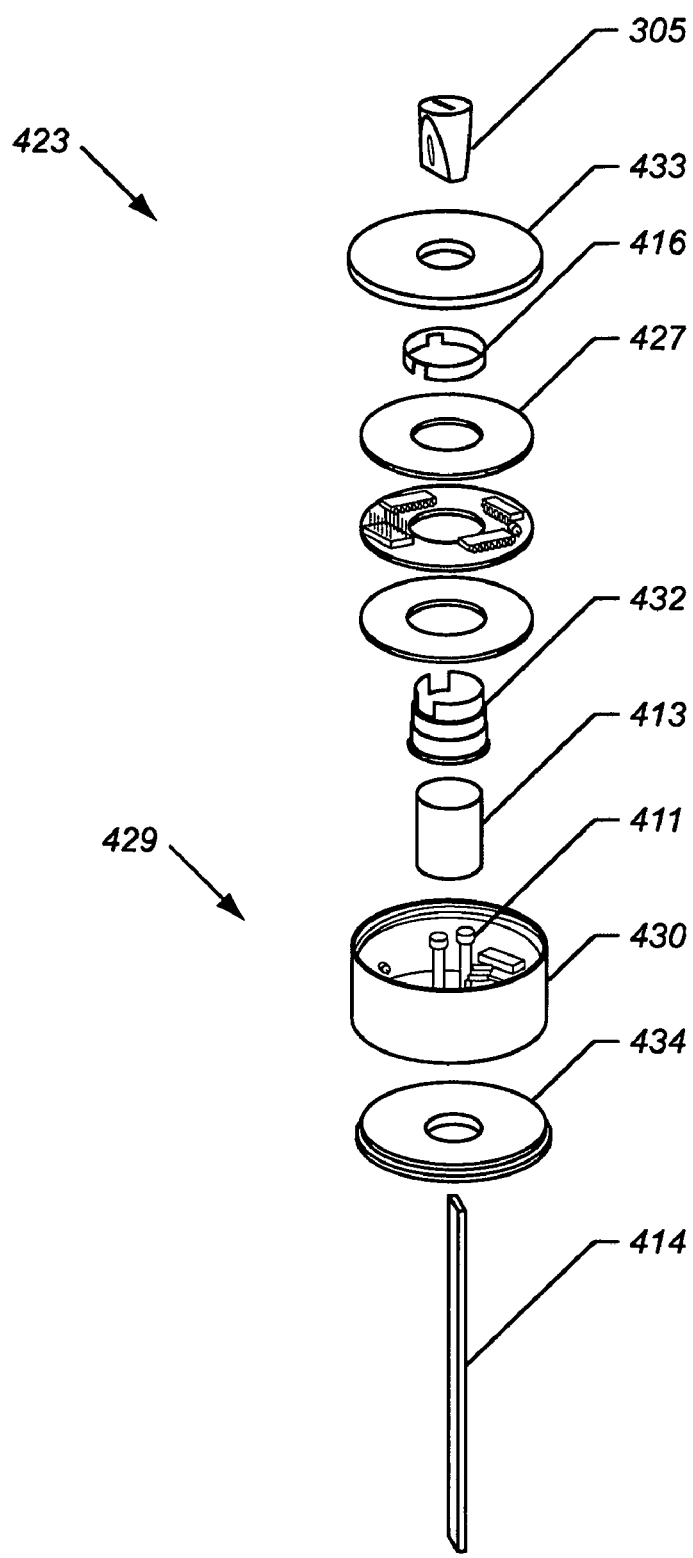
FIG. 38 is an exploded perspective view of the RF sensor of FIG. 35.

In use, two of these clamp assemblies are disposed within a sleeve 413, and the bar-shaped current carrier 414 is positioned between them (see FIG. 36). As the cap screw on the clamp assemblies are tightened, the bar-shaped current carrier is pressed between the opposing clamp assemblies, thus firmly gripping it in place.

FIGS. 35-38 show different views of a complete RF sensor 423 that incorporates the clamp assembly of FIGS. 31-34. The sensor 423 includes a series of (preferably digital) circuit boards 427 which perform the logical functions of the sensor. The circuit boards preferably comprise one or more memory chips which store calibration information, and are secured within a circuit board housing 429 defined by the concentric walls of outer housing 430 and inner support 432. First and second opposing end caps 433, 434 are provided to protect the circuit boards from the ambient environment. The end caps 433, 434 are provided with threaded lips 435, 436, respectively (best seen in FIGS. 35 and 37), each of which rotatingly engages a complimentary set of threads (not shown) defined on the interior surface of outer housing 430.

The clamp assemblies 401 and sleeve 413 (see FIG. 38) are disposed within the outer housing 430. The outer housing 430 has been removed in FIG. 35 to show the disposition of the circuit boards 427 about the inner support 432.

The RF sensors described above provide hard, direct contact to the RF current carrier so that accurate DC voltage and inductive current measurements can be obtained, while at the same time permitting RF voltages to be measured through capacitively coupled devices. The provision of such a hard, direct contact is particularly important in high frequency applications (i.e., at frequencies in the megahertz region having harmonics up to 300 MHz or more), since the bulk of the current in these applications flows at or near the surface of the current carrier. By contrast, at lower frequencies (e.g., at 60 Hz), the current flows more or less uniformly across the volume of the carrier. Consequently, while loose-fitting clamp assemblies may be suitable for use in lower frequency applications, such assemblies are typically ill-adapted for use in high frequency applications.

Moreover, as noted above, the clamp assemblies described herein do not add to the electrical length of the current carrier, and hence their use does not require readjustment of calibration coefficients of the RF sensor. The use of the clamp assemblies described herein is also found to reduce parasitic capacitance significantly compared to the use of prior art devices. The embodiments described above illustrate the application of the principles disclosed herein to RF sensors designed to be used in conjunction with rod-shaped or bar-shaped RF current carriers. One skilled in the art will appreciate, however, that these various embodiments may be modified appropriately so that they can be used in conjunction with other types of current carriers. For example, if the current carrier is a coaxial cable, the RF sensor may be fitted with coaxial terminals that are in electrical communication with a bar or rod-shaped conductor. The coaxial terminals may be disposed, for example, on an exterior surface of the circuit board housing or sensor base. The conductor may then be brought into electrical communication with the RF sensor in the manner depicted herein.

The clamp assemblies described above can be used in conjunction with the various devices and improvements to RF sensors as are described in commonly assigned U.S. Ser. No. 10/668,398 entitled "Transducer Package for Process Control", which was filed on Sep. 23, 2003 and which is included herein by reference in its entirety. Thus, for example, the shielding mechanisms described in that application can be used to protect the circuit boards of the RF sensor. Moreover, while the RF sensors disclosed herein have been described primarily in reference to their use with plasma etch reactors, one skilled in the art will appreciate that these devices have uses in various other applications where it is important to monitor or determine the attributes of an RF power supply.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the present disclosure (and especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the subject matter disclosed herein and does not pose a limitation on the scope of the disclosure unless otherwise claimed. No language in the specification should be construed as indicating any non-claimed element as essential to the practice or implementation of the teachings herein.

Preferred embodiments of this disclosure are described herein, including the best mode known to the inventors for carrying out the teachings herein. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An RF sensor, comprising:
    a chassis;
    a clamping mechanism disposed within said chassis, said clamping mechanism being releasably attached to an RF current carrier; and
    at least one circuit board disposed within said chassis, said circuit board being in electrical contact with said clamping mechanism;
    wherein said chassis comprises a first portion which houses said at least one circuit board, and a second portion which houses said clamping mechanism, and wherein said RF current carrier is in electrical contact with an RF current source having a frequency of at least 250 MHz.

2. The RF sensor of claim 1, wherein said first portion is releasably attached to said second portion.

3. The RF sensor of claim 1, wherein said clamping mechanism comprises a rigid metal collar which is disposed within said second portion of said chassis.

4. The RF sensor of claim 3, wherein said clamping mechanism comprises at least one expandable clamping element which is disposed within said rigid collar.

5. The RF sensor of claim 4, wherein said expandable clamping element is adapted to press said current carrier against said rigid collar.

6. The RF sensor of claim 4, wherein said expandable clamping element is adapted to press said current carrier against a second clamping element which is also disposed within said rigid collar.

7. The RF sensor of claim 6, wherein said first and second clamping elements comprise electrically conductive materials.

8. The RF sensor of claim 1, wherein said at least one circuit board contains signal processing circuitry.

9. The RF sensor of claim 8, wherein said signal processing circuitry includes a local oscillator, a low pass filter and an analog to digital converter.

10. The RF sensor of claim 1 releasably attached to an RF current carrier, wherein said RF current carrier is in electrical contact with an RF current source having a frequency of at least about 300 MHz.

11. The RF sensor of claim 1, wherein the RF current carrier is connected to a plasma reactor.

12. The RF sensor of claim 11, wherein said RF current carrier is disposed between said plasma reactor and an external power supply.

13. The RF sensor of claim 1, wherein said clamp assembly comprises a first element which slidingly engages a second element so as to apply pressure on the current carrier.

14. The RF sensor of claim 13, wherein said first element is wedge-shaped.

15. The RF sensor of claim 13, wherein said first and second elements are engaged across first and second opposing surfaces, respectively, wherein said first surface is driven across said second surface by a fastener, and wherein the combination of said first and second elements expands when said first surface is driven across said second surface by said fastener.

16. The RF sensor of claim 15, wherein said first and second elements are disposed within a rigid collar.

17. The RF sensor of claim 1, wherein said at least one circuit board is in electrical contact with the current carrier.

18. The RF sensor of claim 17, wherein said at least one circuit board is in electrical contact with the current carrier by way of said clamping mechanism.

19. The RF sensor of claim 1, wherein said circuit board contains circuitry which is in electrical contact with said clamping mechanism.

20. An RF sensor, comprising:
    a chassis;
    a clamping mechanism disposed within said chassis, said clamping mechanism being releasably attachable to an RF current carrier; and
    at least one circuit board disposed within said chassis, said circuit board being in electrical contact with said clamping mechanism;
    wherein said chassis comprises a first portion which houses said at least one circuit board, and a second portion which houses said clamping mechanism, and wherein said clamping mechanism comprises a first element which slidingly engages a second element so as to apply pressure on the current carrier.

21. The RF sensor of claim 20, wherein said RF current carrier is in electrical contact with an RF current source having a frequency of at least about 150 MHz.

22. The RF sensor of claim 20, wherein said RF current carrier is in electrical contact with an RF current source having a frequency of at least about 250 MHz.

23. The RF sensor of claim 20, wherein said RF current carrier is in electrical contact with an RF current source having a frequency of at least about 300 MHz.

24. The RF sensor of claim 20, wherein said at least one circuit board is in electrical contact with the current carrier by way of said clamping mechanism.

25. The RF sensor of claim 20, wherein the RF current carrier is connected to a plasma reactor.

26. The RF sensor of claim 20, wherein said RF current carrier is disposed between said plasma reactor and an external power supply.

27. The RF sensor of claim 20, wherein said at least one circuit board contains signal processing circuitry.

28. The RF sensor of claim 27, wherein said signal processing circuitry includes a local oscillator, a low pass filter and an analog to digital converter.

* * * * *